(12) United States Patent
Lee et al.

(10) Patent No.: US 12,178,034 B2
(45) Date of Patent: Dec. 24, 2024

(54) SEMICONDUCTOR DEVICE INCLUDING BURIED CONTACT AND METHOD FOR MANUFACTURING THE SAME

(71) Applicant: SAMSUNG ELECTRONICS CO., LTD., Suwon-si (KR)

(72) Inventors: Jeonil Lee, Suwon-si (KR); Youngjun Kim, Gwangju (KR); Jinbum Kim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/501,576

(22) Filed: Nov. 3, 2023

(65) Prior Publication Data

US 2024/0098974 A1 Mar. 21, 2024

Related U.S. Application Data

(62) Division of application No. 17/579,919, filed on Jan. 20, 2022, now Pat. No. 11,844,207.

(30) Foreign Application Priority Data

Aug. 12, 2021 (KR) .................. 10-2021-0106399

(51) Int. Cl.
*H10B 12/00* (2023.01)

(52) U.S. Cl.
CPC ....... *H10B 12/315* (2023.02); *H10B 12/0335* (2023.02); *H10B 12/37* (2023.02); *H10B 12/482* (2023.02)

(58) Field of Classification Search
CPC ...... H10B 12/00; H10B 12/09; H10B 12/033; H10B 12/053; H10B 12/50; H10B 12/34; H10B 12/37; H10B 12/315; H10B 12/482; H10B 12/485; H10B 12/0335; H01L 27/108; H01L 27/10814; H01L 27/10829; H01L 27/10855; H01L 27/10885; H01L 21/768; H01L 21/76897; H01L 21/02; H01L 21/027; H01L 21/033; H01L 21/8238; H01L 21/823807; H01L 21/0337; H01L 21/02142; H01L 21/02293; H01L 21/0274; H01L 21/76877
(Continued)

(56) References Cited

U.S. PATENT DOCUMENTS

| 6,589,837 B1 | 7/2003 | Ban et al. |
| 9,437,560 B2 | 9/2016 | Park et al. |

(Continued)

FOREIGN PATENT DOCUMENTS

| KR | 10-1062838 B1 | 9/2011 |
| KR | 10-2020-0107895 A1 | 9/2020 |

*Primary Examiner* — Chuong A Luu
(74) *Attorney, Agent, or Firm* — Muir Patent Law, PLLC

(57) ABSTRACT

A semiconductor device including an active pattern; a gate structure connected to the active pattern; a bit line structure connected to the active pattern; a buried contact connected to the active pattern; a contact pattern covering the buried contact; a landing pad connected to the contact pattern; and a capacitor structure connected to the landing pad, wherein the buried contact includes a first growth portion and a second growth portion spaced apart from each other, and the landing pad includes an interposition portion between the first growth portion and the second growth portion.

13 Claims, 40 Drawing Sheets

(58) Field of Classification Search
USPC .......................................................... 257/296
See application file for complete search history.

(56) References Cited

U.S. PATENT DOCUMENTS

| | | | |
|---|---|---|---|
| 10,204,910 B2 | 2/2019 | Kim et al. | |
| 10,586,798 B2 | 3/2020 | Kim et al. | |
| 10,804,277 B2 | 10/2020 | Kim et al. | |
| 2001/0053575 A1 | 12/2001 | Noble | |
| 2008/0122554 A1* | 5/2008 | Harada | H03H 9/0561 |
| | | | 333/25 |
| 2013/0069052 A1 | 3/2013 | Sandhu | |
| 2015/0099344 A1 | 4/2015 | Kim et al. | |
| 2018/0122811 A1* | 5/2018 | Kim | H10B 12/34 |
| 2019/0214345 A1* | 7/2019 | Shin | H01L 29/0843 |
| 2021/0035983 A1 | 11/2021 | Song et al. | |

* cited by examiner

SEMICONDUCTOR DEVICE INCLUDING BURIED CONTACT AND METHOD FOR MANUFACTURING THE SAME

CROSS-REFERENCE TO THE RELATED APPLICATION

This application is a Divisional of and claims priority to U.S. patent application Ser. No. 17/579,919 filed on Jan. 20, 2022, which claims priority from Korean Patent Application No. 10-2021-0106399, filed on Aug. 12, 2021, in the Korean Intellectual Property Office, the disclosure of each of these applications being incorporated herein by reference in its entirety.

BACKGROUND

1. Field

Embodiments relate to a semiconductor device including a buried contact and a method for manufacturing the same.

2. Description of the Related Art

A semiconductor device is being highlighted as an important element in electronic industries by virtue of characteristics thereof such as miniaturization, multifunctionalization, low manufacturing costs, etc. Semiconductor devices may be classified into a semiconductor memory device to store logic data, a semiconductor logic device to arithmetically process logic data, a hybrid semiconductor device including a memory element and a logic element, and the like. In accordance with high advances in electronics industries, demand for specific characteristics of semiconductor devices is gradually increasing. Demand for high reliability, high speed, multifunctionalization, etc. of semiconductor devices is gradually increasing. In order to satisfy such specific characteristics, structures in semiconductor devices may become more and more complicated. In addition, semiconductor devices may become more and more highly integrated.

SUMMARY

The embodiments may be realized by providing a semiconductor device including an active pattern; a gate structure connected to the active pattern; a bit line structure connected to the active pattern; a buried contact connected to the active pattern; a contact pattern covering the buried contact; a landing pad connected to the contact pattern; and a capacitor structure connected to the landing pad, wherein the buried contact includes a first growth portion and a second growth portion spaced apart from each other, and the landing pad includes an interposition portion between the first growth portion and the second growth portion.

The embodiments may be realized by providing a semiconductor device including an active pattern; a gate structure connected to the active pattern; a bit line structure connected to the active pattern; a buried contact connected to the active pattern; and a capacitor structure electrically connected to the buried contact, wherein the buried contact includes a base portion, and a first growth portion and a second growth portion at opposite sides of the base portion, and a level of an uppermost portion of the first growth portion and a level of an uppermost portion of the second growth portion are higher than a level of a top surface of the base portion.

The embodiments may be realized by providing a semiconductor device including an active pattern; a gate structure connected to the active pattern; a bit line structure connected to the active pattern; a buried contact connected to the active pattern; and a capacitor structure electrically connected to the buried contact, wherein the buried contact includes a base portion, and a first growth portion and a second growth portion at opposite sides of the base portion, the first growth portion includes a first upper curved surface and a second upper curved surface at opposite sides of an uppermost portion of the first growth portion; and the second growth portion includes a third upper curved surface and a fourth upper curved surface at opposite sides of an uppermost portion of the second growth portion.

BRIEF DESCRIPTION OF THE DRAWINGS

Features will be apparent to those of skill in the art by describing in detail exemplary embodiments with reference to the attached drawings in which.

DETAILED DESCRIPTION

Figure 1A:
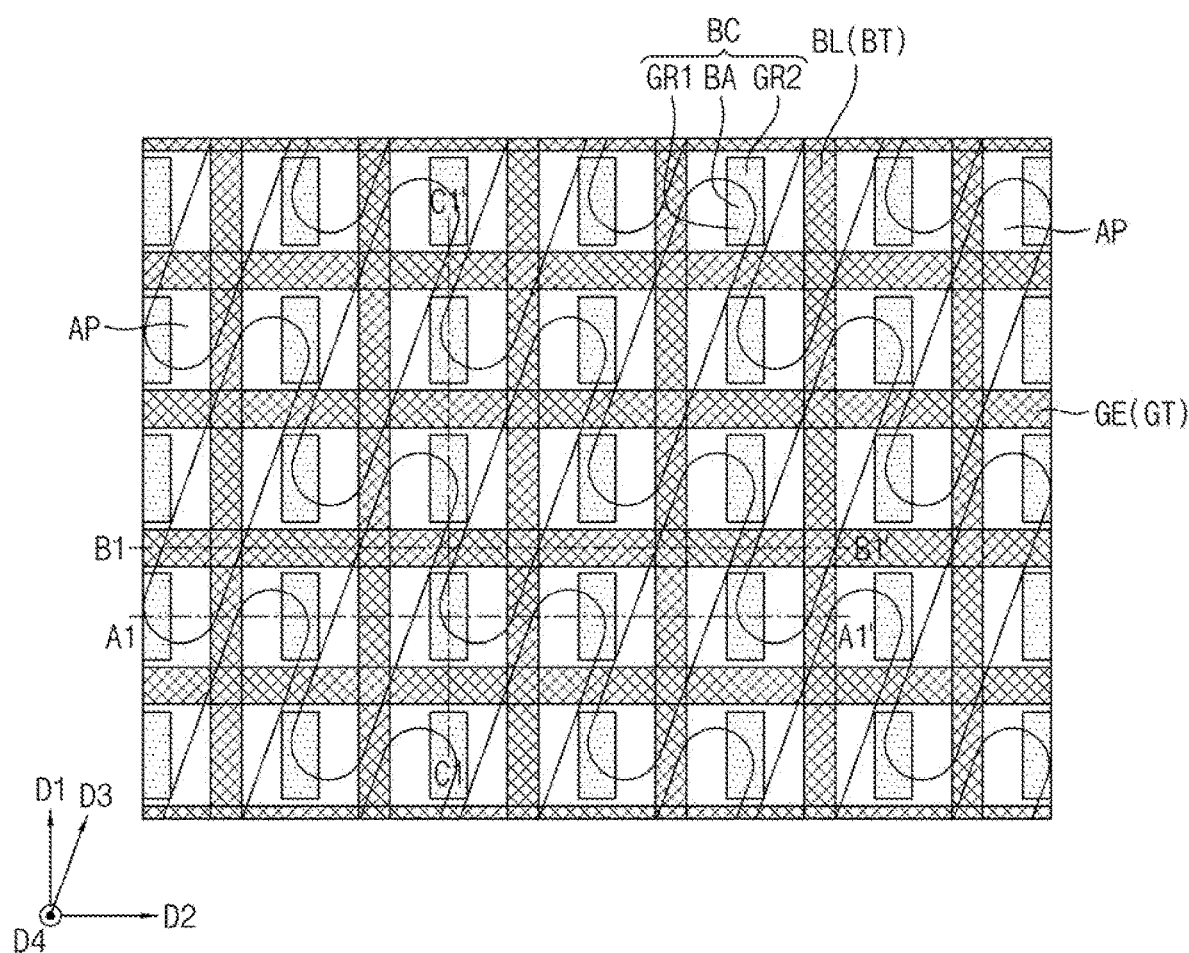
FIG. 1A is a plan view of a semiconductor device according to some exemplary embodiments of the disclosure.
Figure 1B:
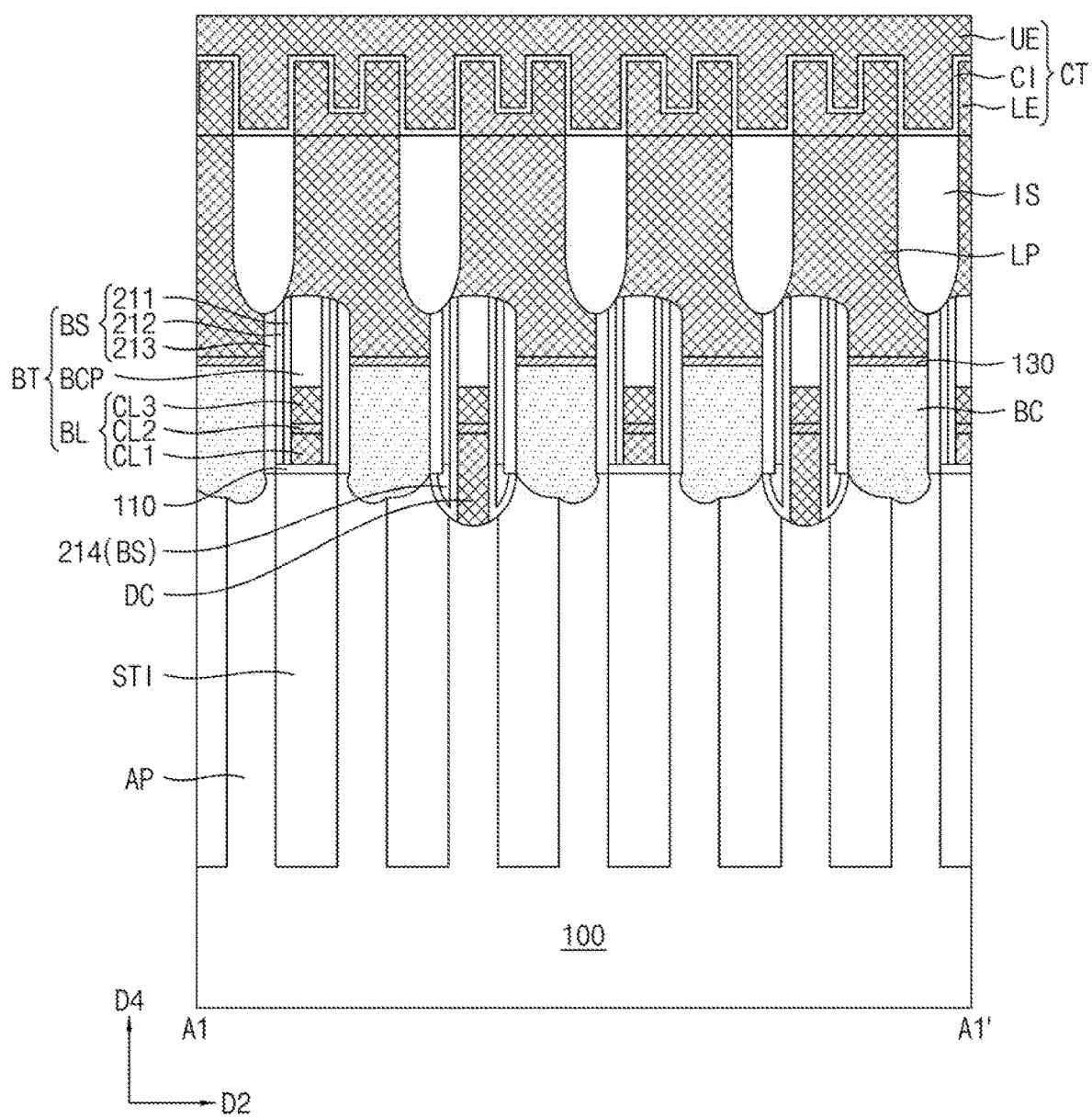
FIG. 1B is a cross-sectional view taken along line A1-A1' in FIG. 1A.
Figure 1C:
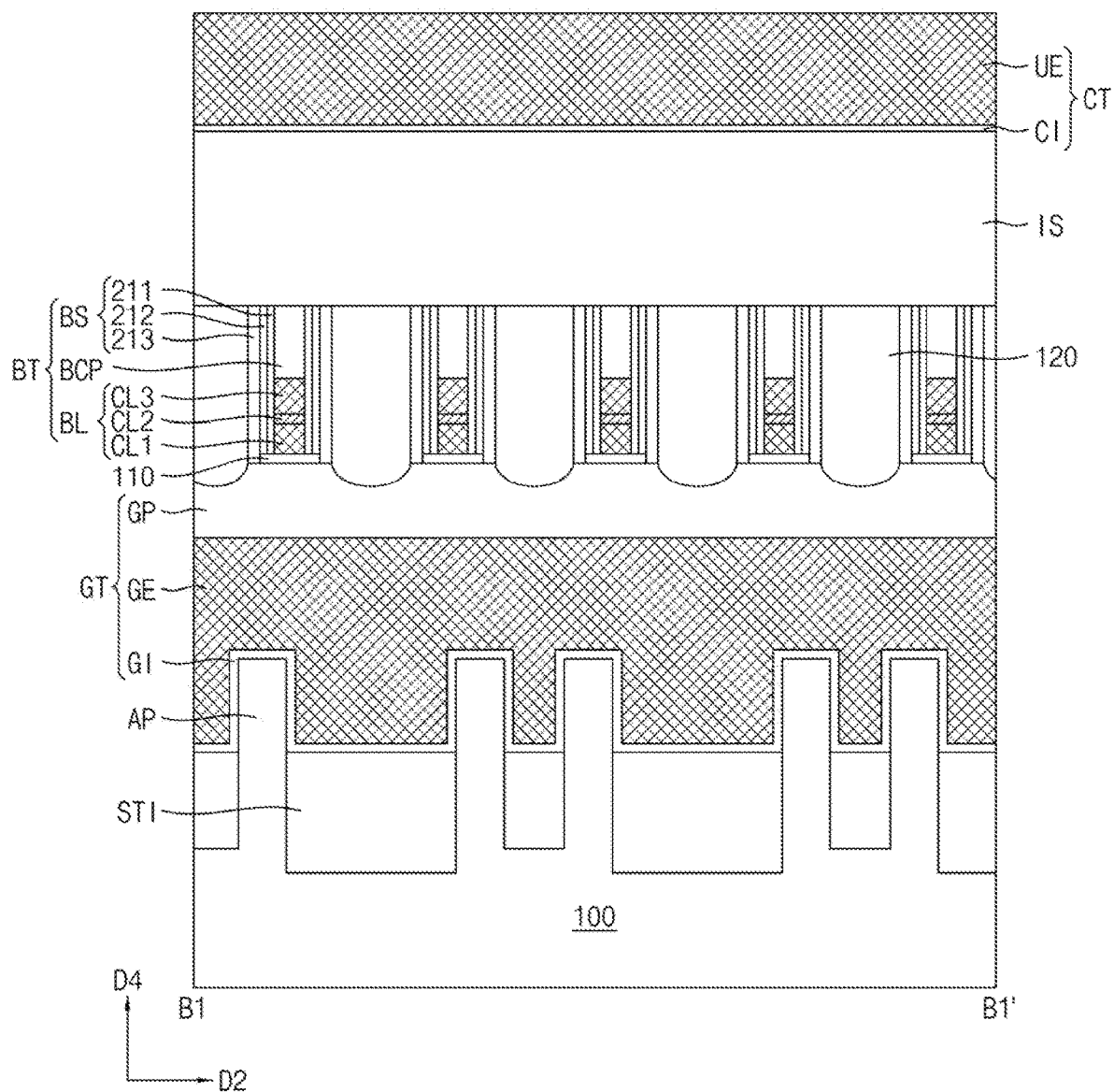
FIG. 1C is a cross-sectional view taken along line B1-B1' in FIG. 1A.
Figure 1D:
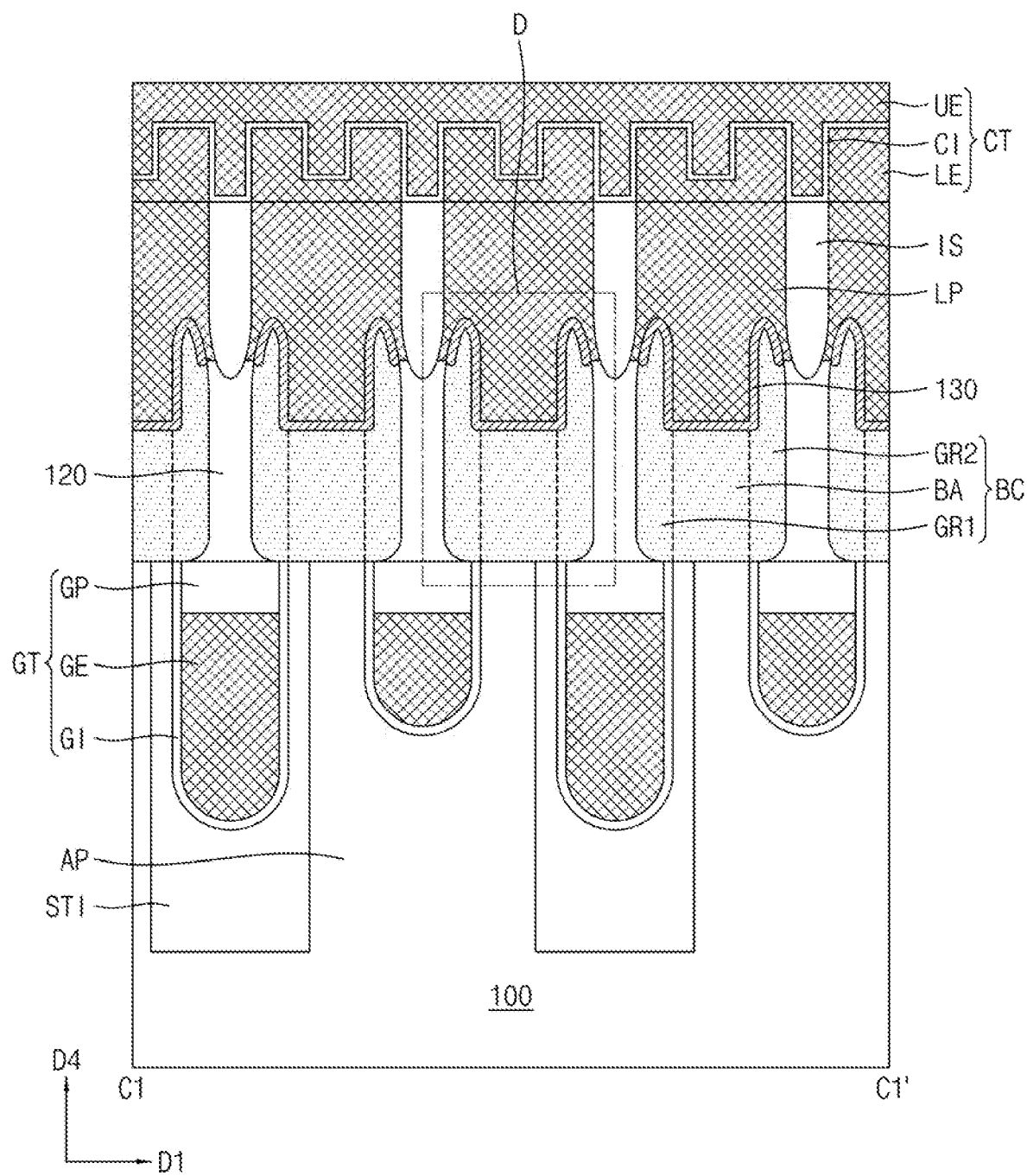
FIG. 1D is a cross-sectional view taken along line C1-C1' in FIG. 1A.
Figure 1E:
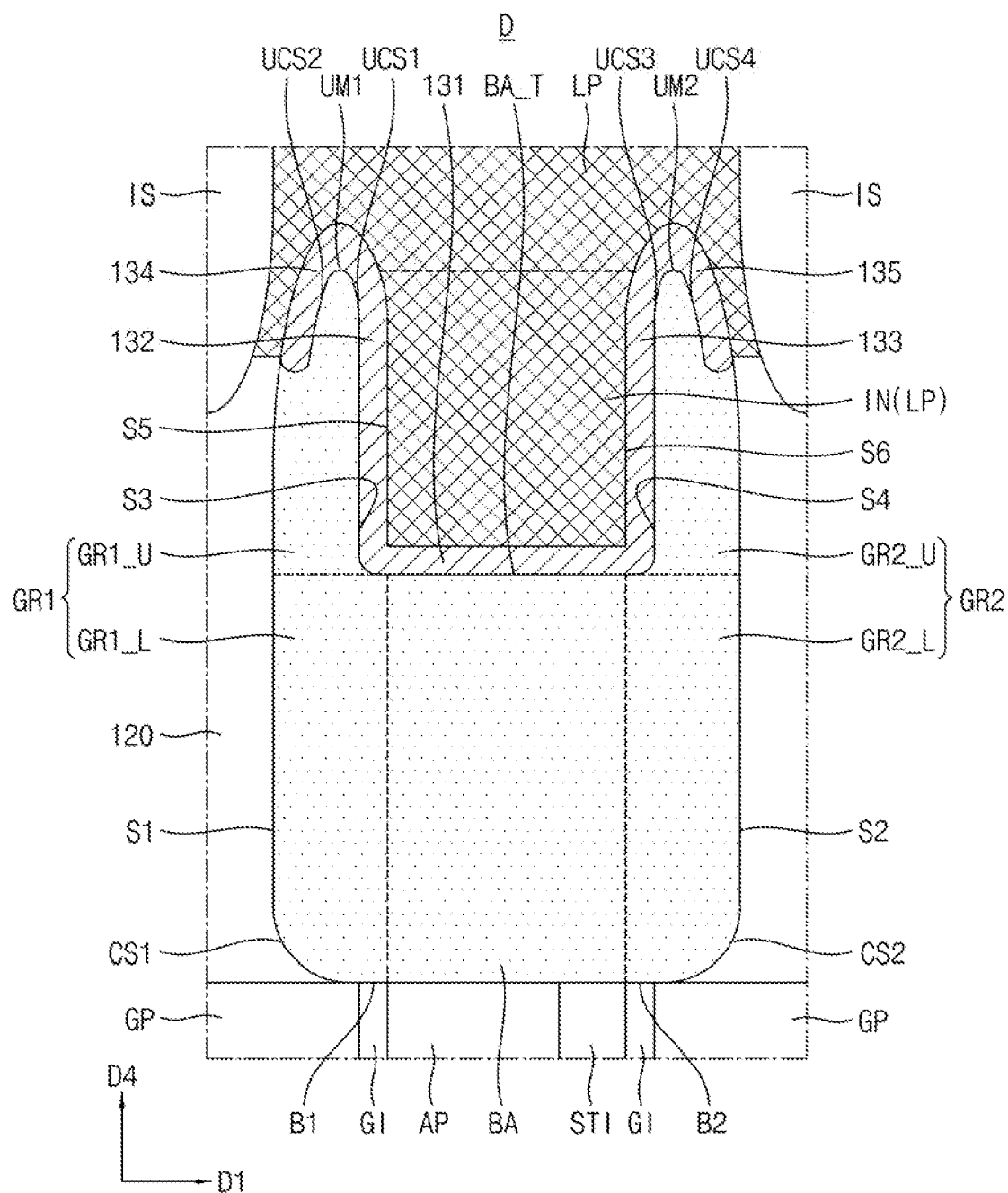
FIG. 1E is an enlarged view of a portion D of FIG. 1D.

FIG. 1A is a plan view of a semiconductor device according to some exemplary embodiments of the disclosure. FIG. 1B is a cross-sectional view taken along line A1-A1' in FIG. 1A. FIG. 1C is a cross-sectional view taken along line B1-B1' in FIG. 1A. FIG. 1D is a cross-sectional view taken along line C1-C1' in FIG. 1A. FIG. 1E is an enlarged view of a portion D of FIG. 1D.

Referring to FIGS. 1A, 1B, 1C and 1D, the semiconductor device may include a substrate 100. The substrate 100 may be a semiconductor substrate. In an implementation, the substrate 100 may be a silicon substrate. The substrate 100 may have the form of a plate extending along a plane defined by a first direction D1 and a second direction D2. The first direction D1 and the second direction D2 may intersect each other. In an implementation, the first direction D1 and the second direction D2 may perpendicularly intersect each other.

The substrate 100 may include active patterns AP. The active patterns AP may extend (e.g., lengthwise) in a third direction D3. The third direction D3 may intersect the first direction D1 and the second direction D2. The third direction D3 may be parallel to the plane defined by the first direction D1 and the second direction D2. Upper portions of the substrate 100 protruding in a fourth direction D4 may be defined as the active patterns AP. The fourth direction D4 may intersect the first direction D1, the second direction D2 and the third direction D3. In an implementation, the fourth direction D4 may perpendicularly intersect the first direction D1, the second direction D2 and the third direction D3. The active patterns AP may be spaced apart from one another.

An element isolation layer STI may be in a space among or between the active patterns AP. The active patterns AP may be defined by the element isolation layer STI. Each of the active patterns AP may be surrounded by the element isolation layer STI. The active patterns AP may be spaced apart from one another by the element isolation layer STI. The element isolation layer STI may include an insulating material. In an implementation, the element isolation layer STI may include an oxide.

Gate structures GT extending in the second direction D2 may be provided. The gate structures GT may be spaced apart from one another in the first direction D1. The gate structure GT may be on the element isolation layer STI and the active patterns AP. One gate structure GT may be connected to a plurality of active patterns AP.

The gate structures GT may extend through the active patterns AP in the second direction D2. In an implementation, two gate structures GT may extend through one active pattern AP, or other numbers of gate structure GT may be included.

In an implementation, each active pattern AP may include a first impurity region between two gate structures GT extending through the active pattern AP, and second impurity regions spaced apart from each other under the condition that the first impurity region is therebetween. The gate structure GT may be between the first impurity region and the second impurity region.

Each of the gate structures GT may include a gate insulating layer GI, a gate electrode GE, and a gate capping layer GP. The gate insulating layer GI may cover surfaces of the active patterns AP and the element isolation layer STI. The gate electrode GE and the gate capping layer GP may be inside the gate insulating layer GI. The gate electrode GE may be spaced apart from the active pattern AP by the gate insulating layer GI. The gate capping layer GP may cover a top surface of the gate electrode GE. The gate insulating layer GI may include an insulating material. In an implementation, the gate insulating layer GI may include an oxide. The gate electrode GE may include a conductive material. In an implementation, the gate electrode GE may include tungsten, ruthenium, titanium nitride, or molybdenum. The gate capping layer GP may include an insulating material. In an implementation, the gate capping layer GP may include an oxide. As used herein, the term "or" is not an exclusive term, e.g., "A or B" would include A, B, or A and B.

An interlayer insulating layer 110 may be on the gate capping layer GP, the element isolation layer STI and the active pattern AP. The interlayer insulating layer 110 may include an insulating material. In an implementation, the interlayer insulating layer 110 may be multiple insulating layers. In an implementation, the interlayer insulating layer 110 may include an oxide layer and a nitride layer.

Bit line structures BT extending in the first direction D1 may be provided. The bit line structures BT may be spaced apart from one another in the second direction D2. The bit line structure BT may be on the interlayer insulating layer 110, the active patterns AP and the element isolation layer STI. One bit line structure BT may be connected to a plurality of active patterns AP.

Each of the bit line structures BT may include a bit line BL, direct contacts DC, bit line spacers BS, and a bit line capping layer BCP. The direct contacts DC may be connected to the first impurity regions of the active patterns AP, respectively. The direct contact DC may include a conductive material.

The bit line BL may be on the direct contacts DC and the interlayer insulating layer 110. The bit line BL may contact a plurality of direct contacts DC. The bit line BL may be electrically connected to the first impurity regions of the active patterns AP via the direct contacts DC.

The bit line BL may include first conductive layers CL1, a second conductive layer CL2, and a third conductive layer CL3. Each of the first conductive layers CL1 may extend in the first direction D1. The direct contact DC may be between adjacent ones of the first conductive layers CL1 in the first direction D1. In an implementation, the first conductive layers CL1 may be at opposite sides of the direct contact DC. In an implementation, the direct contacts DC and the first conductive layers CL1 may be coupled without any boundary and, as such, may constitute an integrated structure. The second conductive layer CL2 may be on the first conductive layers CL1 and the direct contacts DC. The second conductive layer CL2 may extend in the first direction D1. The second conductive layer CL2 may contact a plurality of first conductive layers CL1 and a plurality of direct contacts DC. The third conductive layer CL3 may be on the second conductive layer CL2. The third conductive layer CL3 may extend in the first direction D1. The first conductive layer CL1, the second conductive layer CL2, and the third conductive layer CL3 may include a conductive material.

In an implementation, as illustrated in the drawings, the bit line BL may include the first conductive layers CL1, the second conductive layer CL2 and the third conductive layer CL3. In an implementation, the bit line BL may be a single conductive layer.

The bit line capping layer BCP may be on the bit line BL. The bit line capping layer BCP may extend in the first direction D1. The bit line capping layer BCP may cover a top surface of the third conductive layer CL3 of the bit line BL. The bit line capping layer BCP may include an insulating material. In an implementation, the bit line capping layer BCP may include an oxide.

The direct contacts DC, the bit line BL, and the bit line capping layer BCP may be between the bit line spacers BS of the bit line structure BT. The bit line spacers BS of the bit line structure BT may be spaced apart from each other in the second direction D2 under the condition that the direct contacts DC, the bit line BL, and the bit line capping layer BCP are therebetween. The bit line spacers BS of the bit line structure BT may cover opposite side walls of each of the direct contacts DC, the bit line BL and the bit line capping layer BCP. The bit line spacers BS may extend in the first direction D1.

The bit line spacer BS may be multiple insulating layers. The bit line spacer BS may include a first layer 211, a second layer 212, a third layer 213, and a fourth layer 214. The first to fourth layers 211, 212, 213 and 214 may include an insulating material. In an implementation, each of the first to fourth layers 211, 212, 213 and 214 may independently include an oxide or a nitride. In an implementation, the bit line spacer BS may include four layers 211, 212, 213 and 214, or a different number of layers.

Buried contacts BC may be provided. The second impurity regions of the active pattern AP may be connected to the buried contacts BC, respectively. The buried contact BC may be between the bit line structures BT. In an implementation, the bit line structures BT may be at opposite sides of the buried contact BC. The buried contact BC may include a conductive material. In an implementation, the buried contact BC may include monocrystalline silicon doped with impurities.

The buried contact BC may include a base portion BA, a first growth portion GR1, and a second growth portion GR2. The base portion BA may be a portion centrally defined in the buried contact BC, and the first and second growth portions GR1 and GR2 may be portions at opposite sides of the base portion BA. The first and second growth portions GR1 and GR2 may be spaced apart from each other in the first direction D1. The base portion BA may be between the first and second growth portions GR1 and GR2 and, as such, may interconnect the first and second growth portions GR1 and GR2.

In an implementation, the buried contact BC may overlap with the gate electrode GE in the fourth direction D4. In an implementation, the buried contact BC may not overlap with the gate electrode GE in the fourth direction D4.

Insulating fences 120 may be provided. The insulating fences 120 may be on the gate capping layer GP of the gate structure GT. The insulating fence 120 may be between the buried contacts BC. In an implementation, the buried contacts BC may be at opposite sides of the insulating fence 120. The insulating fence 120 may be between the bit line structures BT. In an implementation, the bit line structures BT may be at opposite sides of the insulating fence 120. The insulating fence 120 may include an insulating material. In an implementation, the insulating fence 120 may include a nitride.

Contact patterns 130 may be on the buried contacts BC, respectively. The contact pattern 130 may cover the buried contact BC. The contact pattern 130 may include a conductive material. In an implementation, the contact pattern 130 may include cobalt silicide, manganese silicide, or nickel silicide.

An insulating structure IS may be provided. The insulating structure IS may be on the bit line structures BT and the insulating fences 120. The insulating structure IS may include an insulating material. In an implementation, the insulating structure IS may be multiple insulating layers.

Landing pads LP may be provided. The landing pad LP may be on the contact pattern 130. The landing pad LP may be connected to the contact pattern 130. The landing pad LP may be on the bit line structure BT. A lower portion of the landing pad LP may be among or between the bit line structures BT. An upper portion of the landing pad LP may be surrounded by the insulating structure IS. The landing pad LP may be electrically connected to the buried contact BC via the contact pattern 130. The landing pad LP may include a conductive material. In an implementation, the landing pad LP may include a diffusion barrier layer contacting the contact pattern 130.

A capacitor structure CT may be on the landing pads LP and the insulating structure IS. The capacitor structure CT may be connected to the landing pads LP. The capacitor structure CT may include lower electrodes LE, a capacitor insulating layer CI, and an upper electrode UE. The capacitor structure CT may be electrically connected to the second impurity region of the active pattern AP via the landing pad LP, the contact pattern 130 and the buried contact BC. The contact pattern 130 and the landing pad LP may be between the buried contact BC and the capacitor structure CT. The contact pattern 130 may be between the landing pad LP and the buried contact BC.

The lower electrodes LE may contact the landing pads LP, respectively. The capacitor insulating layer CI may be between the lower electrodes LE and the upper electrode UE. The capacitor insulating layer CI may include an insulating material. In an implementation, the capacitor insulating layer CI may include an oxide. The lower electrodes LE and the upper electrode UE may include a conductive material.

Referring to FIG. 1E, the first growth portion GR1 of the buried contact BC may include an upper portion GR1_U and a lower portion GR_1L, and the second growth portion GR2 of the buried contact BC may include an upper portion GR2_U and a lower portion GR2_L. The lower portions GR1_L and GR2_L of the first and second growth portions GR1 and GR2 may be portions at the same level (e.g., same distance from the substrate 100 in the fourth direction D4) as the base portion BA of the buried contact BC. The upper portions GR1_U and GR2_U of the first and second growth portions GR1 and GR2 may be portions at a higher level than the base portion BA of the buried contact BC. The upper portions GR1_U and GR2_U of the first and second growth portions GR1 and GR2 may be at a higher level than a top surface BA_T of the base portion BA. An uppermost portion UM1 of the first growth portion GR1 and an uppermost portion UM2 of the second growth portion GR2 may be at a higher level than the top surface BA_T of the base portion BA. The upper portions GR1_U and GR2_U of the first and second growth portions GR1 and GR2 may be spaced apart from each other in the first direction D1.

The first and second growth portions GR1 and GR2 may contact the insulating fences 120, respectively. The base portion BA may be spaced apart from the insulating fences 120 by the first and second growth portions GR1 and GR2.

The first growth portion GR1 may include a first lower curved surface CS1 between an outer side surface S1 thereof and a bottom surface B1 thereof. The first lower curved surface CS1 of the first growth portion GR1 may interconnect the outer side surface S1 and the bottom surface B1 of the first growth portion GR1. The outer side surface S1 and the first lower curved surface CS1 of the first growth portion GR1 may contact the insulating fence 120.

The second growth portion GR2 may include a second lower curved surface CS2 between an outer side surface S2 thereof and a bottom surface B2 thereof. The second lower curved surface CS2 of the second growth portion GR2 may interconnect the outer side surface S2 and the bottom surface B2 of the second growth portion GR2. The outer side surface S2 and the second lower curved surface CS2 of the second growth portion GR2 may contact the insulating fence 120.

The uppermost portion UM1 of the first growth portion GR1 may be defined between the outer side surface S1 of the first growth portion GR1 and an inner side surface S3 of the first growth portion GR1. The uppermost portion UM1 of the first growth portion GR1 may be an uppermost portion of the upper portion GR1_U of the first growth portion GR1. The first growth portion GR1 may include a first upper curved surface UCS1 and a second upper curved surface UCS2 at opposite sides of the uppermost portion UM1. The uppermost portion UM1 of the first growth portion GR1 may be between the first and second upper curved surfaces UCS1 and UCS2. The first upper curved surface UCS1 may be connected to the inner side surface S3 of the first growth portion GR1. The second upper curved surface UCS2 may be connected to the outer side surface Si of the first growth portion GR1. The first and second upper curved surfaces UCS1 and UCS2 may be interconnected. A distance between the first and second upper curved surfaces UCS1 and UCS2 in the first direction D1 may gradually decrease as the first growth portion GR1 extends to the uppermost portion UM1 thereof. The width of the first growth portion GR1 in the first direction D1 may gradually decrease as the first growth portion GR1 extends to the uppermost portion UM1 thereof (e.g., the upper portion GR1_U of the first growth portion GR1 may have an upwardly tapered shape).

The uppermost portion UM2 of the second growth portion GR2 may be defined between the outer side surface S2 of the second growth portion GR2 and an inner side surface S4 of the second growth portion GR2. The uppermost portion UM2 of the second growth portion GR2 may be an uppermost portion of the upper portion GR2_U of the second growth portion GR2. The second growth portion GR2 may include a third upper curved surface UCS3 and a fourth upper curved surface UCS4 at opposite sides of the uppermost portion UM2. The uppermost portion UM2 of the second growth portion GR2 may be between the third and fourth upper curved surfaces UCS3 and UCS4. The third upper curved surface UCS3 may be connected to the inner side surface S4 of the second growth portion GR2. The fourth upper curved surface UCS4 may be connected to the outer side surface S2 of the second growth portion GR2. The third and fourth upper curved surfaces UCS3 and UCS4 may be interconnected. A distance between the third and fourth upper curved surfaces UCS3 and UCS4 in the first direction D1 may gradually decrease as the second growth portion GR2 extends to the uppermost portion UM2 thereof. The width of the second growth portion GR2 in the first direction D1 may gradually decrease as the second growth portion GR2 extends to the uppermost portion UM2 thereof.

The inner side surface S3 of the first growth portion GR1 and the inner side surface S4 of the second growth portion GR2 may face each other. The inner side surface S3 of the first growth portion GR1 and the inner side surface S4 of the second growth portion GR2 may be spaced apart from each other in the first direction D1. The top surface BA_T of the base portion BA may be (e.g., laterally) between the inner side surface S3 of the first growth portion GR1 and the inner side surface S4 of the second growth portion GR2. The top surface BA_T of the base portion BA may interconnect the inner side surface S3 of the first growth portion GR1 and the inner side surface S4 of the second growth portion GR2. At least portion of the inner side surface S3 of the first growth portion GR1 may extend in the fourth direction D4. In an implementation, at least a portion of the inner side surface S3 of the first growth portion GR1 may extend in a vertical direction. At least portion of the inner side surface S4 of the second growth portion GR2 may extend in the fourth direction D4. In an implementation, at least a portion of the inner side surface S4 of the second growth portion GR2 may extend in the vertical direction. At least a portion of the inner side surface S3 of the first growth portion GR1 and at least a portion of the inner side surface S4 of the second growth portion GR2 may be parallel to each other.

The contact pattern 130 may include a first portion 131 covering the top surface BA_T of the base portion BA, a second portion 132 covering the inner side surface S3 and the first upper curved surface UCS1 of the first growth portion GR1, a third portion 133 covering the inner side surface S4 and the third upper curved surface UCS3 of the second growth portion GR2, a fourth portion 134 covering the second upper curved surface UCS2 of the first growth portion GR1, and a fifth portion 135 covering the fourth upper curved surface UCS4 of the second growth portion GR2.

The first portion 131 of the contact pattern 130 may extend along the top surface BA_T of the base portion BA. The second portion 132 of the contact pattern 130 may extend along the first upper curved surface UCS1 and the inner side surface S3 of the first growth portion GR1 at the uppermost portion UM1 of the first growth portion GR1. The third portion 133 may extend along the third upper curved surface UCS3 and the inner side surface S4 of the second growth portion GR2 at the uppermost portion UM2 of the second growth portion GR2. The fourth portion 134 of the contact pattern 130 may extend along the second upper curved surface UCS2 of the first growth portion GR1 at the uppermost portion UM1 of the first growth portion GR1. The fifth portion 135 of the contact pattern 130 may extend along the fourth upper curved surface UCS4 of the second growth portion GR2 at the uppermost portion UM2 of the second growth portion GR2.

At least a part of the second portion 132 of the contact pattern 130 may extend in the fourth direction D4. In an implementation, at least a part of the second portion 132 of the contact pattern 130 may extend in the vertical direction. At least a part of the third portion 133 of the contact pattern 130 may extend in the fourth direction D4. In an implementation, at least a part of the third portion 133 of the contact pattern 130 may extend in the vertical direction.

The first portion 131 of the contact pattern 130 may be between the upper portion GR1_U of the first growth portion GR1 and the upper portion GR2_U of the second growth portion GR2. The first portion 131 of the contact pattern 130 may interconnect the second and third portions 132 and 133 of the contact pattern 130. The uppermost portion UM1 of the first growth GR1 may be between the second and fourth portions 132 and 134 of the contact pattern 130. The uppermost portion UM2 of the second growth portion GR2 may be between the third and fifth portions 133 and 135 of the contact pattern 130. The contact pattern 130 may cover the uppermost portion UM1 of the first growth portion GR1 and the uppermost portion UM2 of the second growth portion GR2.

The landing pad LP may include an interposition portion IN between the first growth portion GR1 and the second growth portion GR2 of the buried contact BC. In an implementation, the interposition portion IN may be at a level lower than the level of the uppermost portion UM1 of the first growth portion GR1 and the uppermost portion UM2 of the second growth portion GR2. The interposition portion IN may be between the inner side surface S3 of the first growth portion GR1 and the inner side surface S4 of the second growth portion GR2. The interposition portion IN may be between the second portion 132 and the third portion 133 of the contact pattern 130.

The first portion 131 of the contact pattern 130 may be between a bottom surface of the interposition portion IN and the top surface BA_T of the base portion BA. The second portion 132 of the contact pattern 130 may be between a first side surface S5 of the interposition portion IN and the inner side surface S3 of the first growth portion GR1. The third portion 133 of the contact pattern 130 may be between a second side surface S6 of the interposition portion IN and the inner side surface S4 of the second growth portion GR2. The first side surface S5 of the interposition portion IN may face the inner side surface S3 of the first growth portion GR1. The second side surface S6 of the interposition portion IN may face the inner side surface S4 of the second growth portion GR2. The bottom surface of the interposition portion IN may contact the first portion 131 of the contact pattern 130. The first side surface S5 of the interposition portion IN may contact the second portion 132 of the contact pattern 130. The second side surface S6 of the interposition portion IN may contact the third portion 133 of the contact pattern 130.

In the semiconductor device according to the exemplary embodiments, the buried contact BC may include the first and second growth portions GR1 and GR2 and, as such, the surface area of the buried contact BC may be relatively great. In an implementation, resistance to current flowing through the buried contact BC may be reduced.

FIGS. 2A, 3A, 4A, 5A, 6A, 7A, and 8A are plan views of stages in a method for manufacturing a semiconductor device according to FIGS. 1A to 1E. FIGS. 2B, 3B, 3C, 3D, 4B, 4C, 4D, 5B, 5C, 5D, 6B, 6C, 6D, 7B, 7C, 7D, 8B, 9A, 9B, 10A, 10B, 11A, and 11B are cross-sectional views of stages in the method for manufacturing the semiconductor device according to FIGS. 1A to 1E.

Figure 2A:
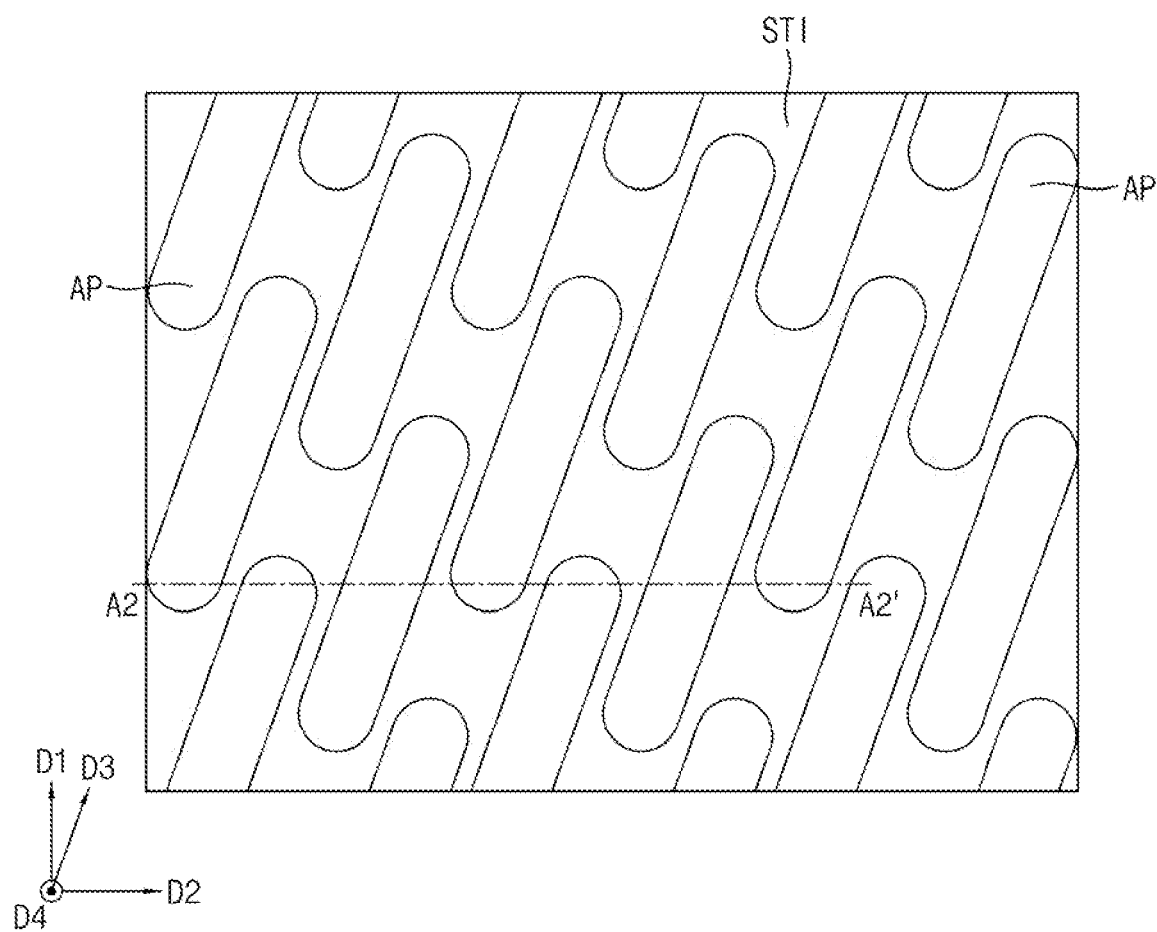
FIGS. 2A, 3A, 4A, 5A, 6A, 7A, and 8A are plan views of stages in a method for manufacturing a semiconductor device according to FIGS. 1A to 1E.
Figure 2B:
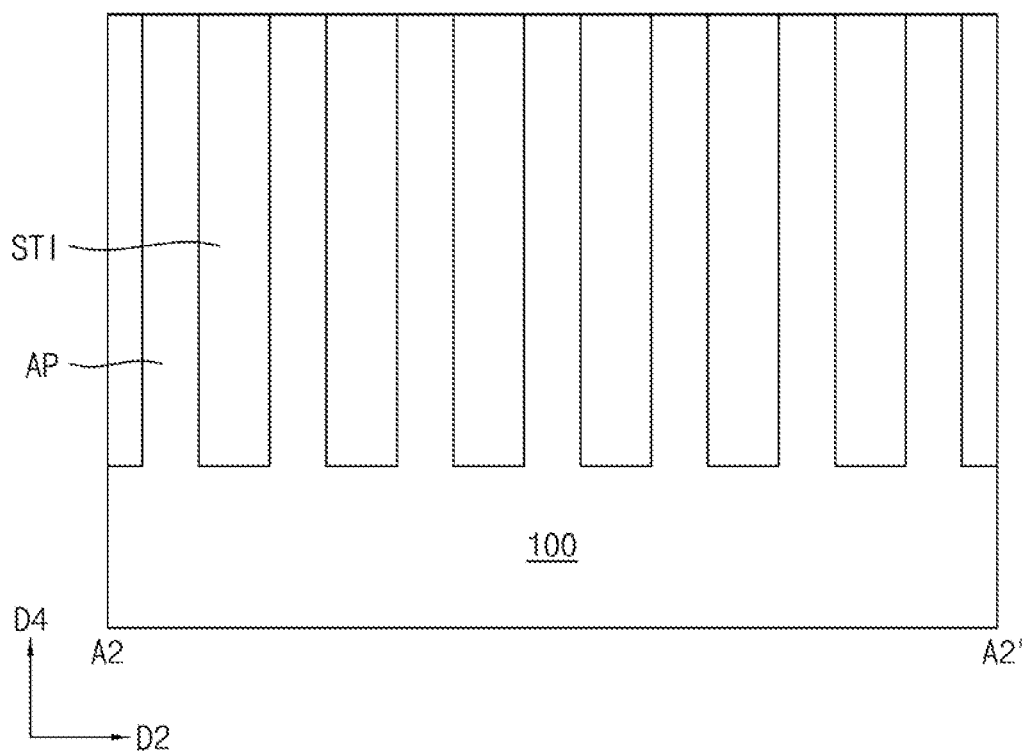
FIGS. 2B, 3B, 3C, 3D, 4B, 4C, 4D, 5B, 5C, 5D, 6B, 6C, 6D, 7B, 7C, 7D, 8B, 9A, 9B, 10A, 10B, 11A, and 11B are cross-sectional views of stages in the method for manufacturing the semiconductor device according to FIGS. 1A to 1E.
Figure 3A:
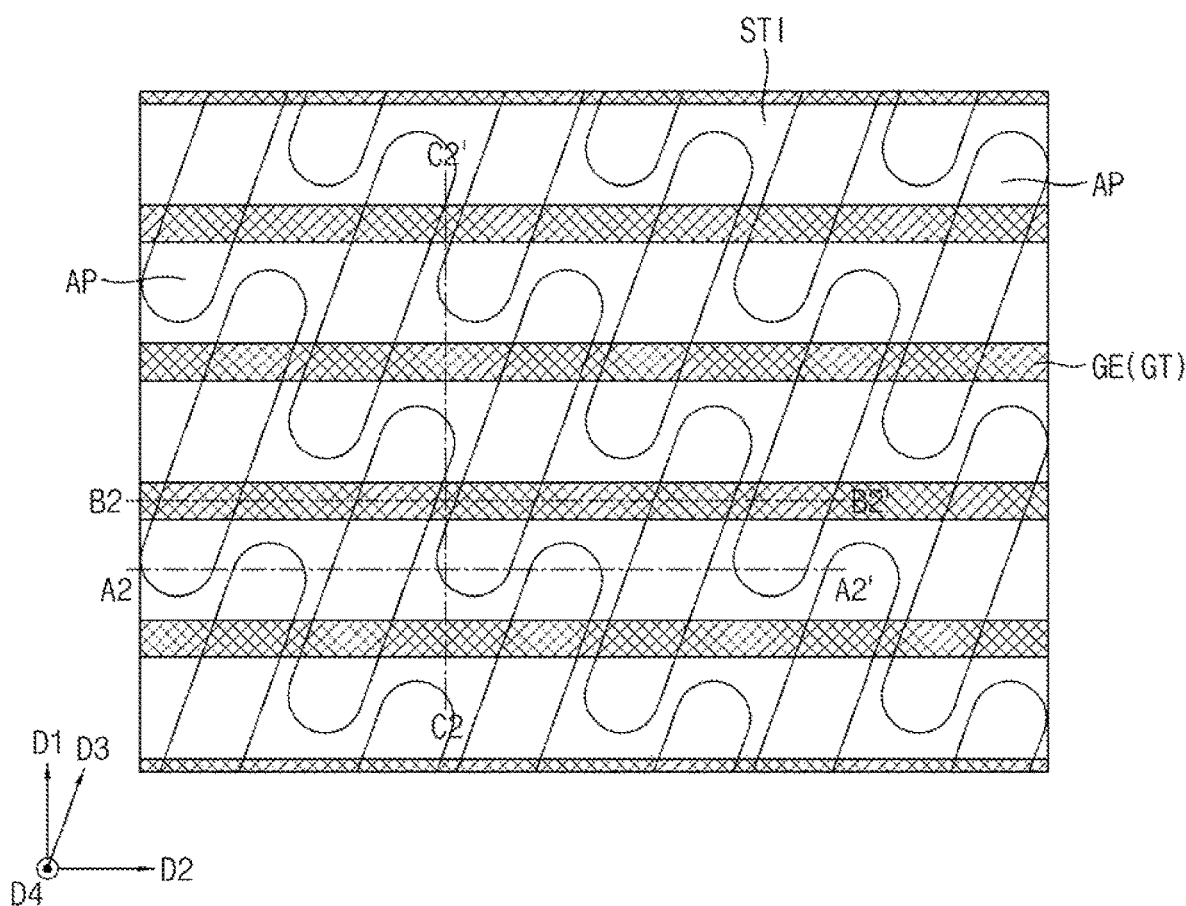
Figure 3B:
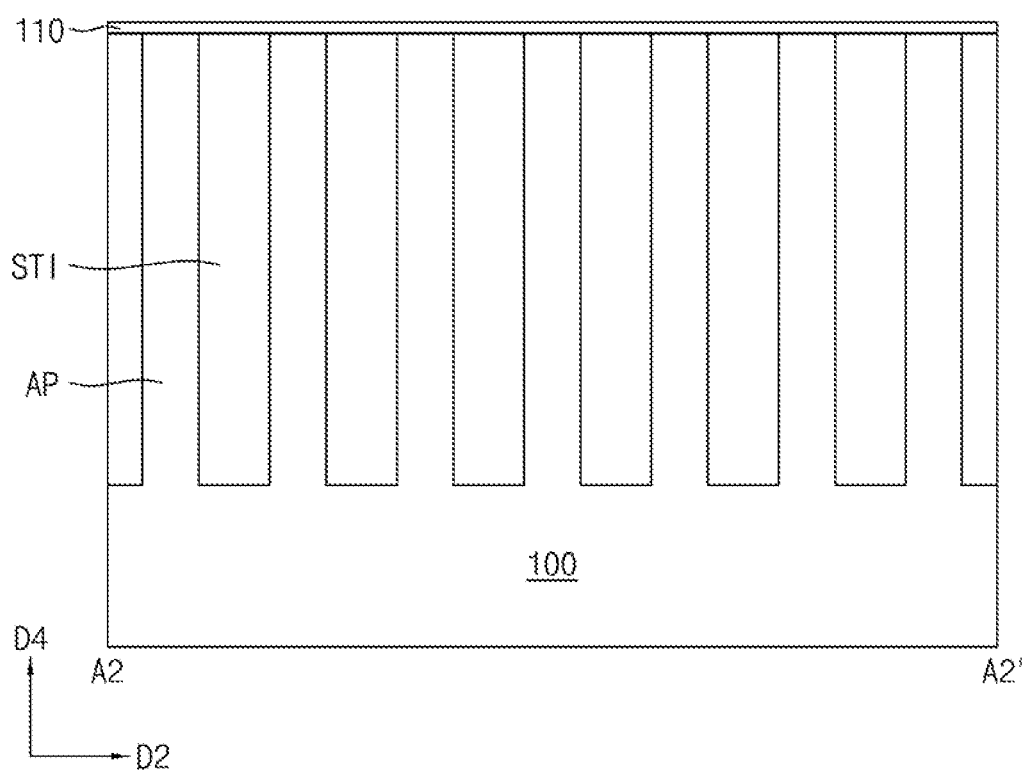
Figure 3C:
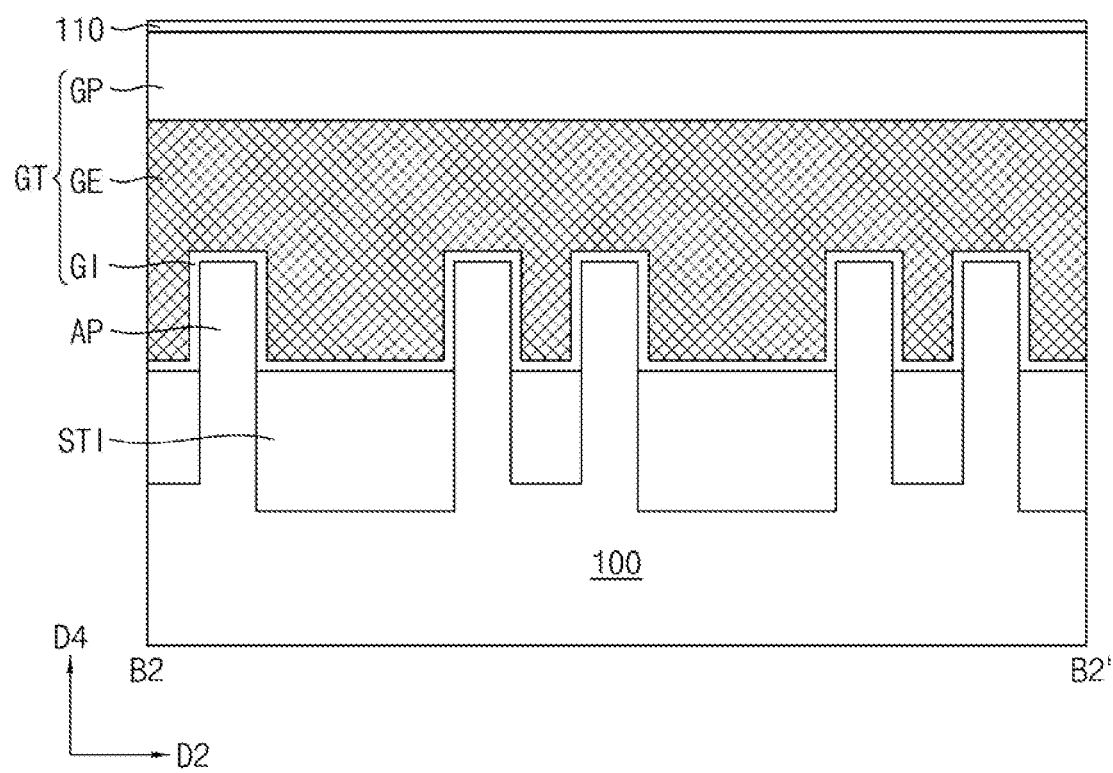
Figure 3D:
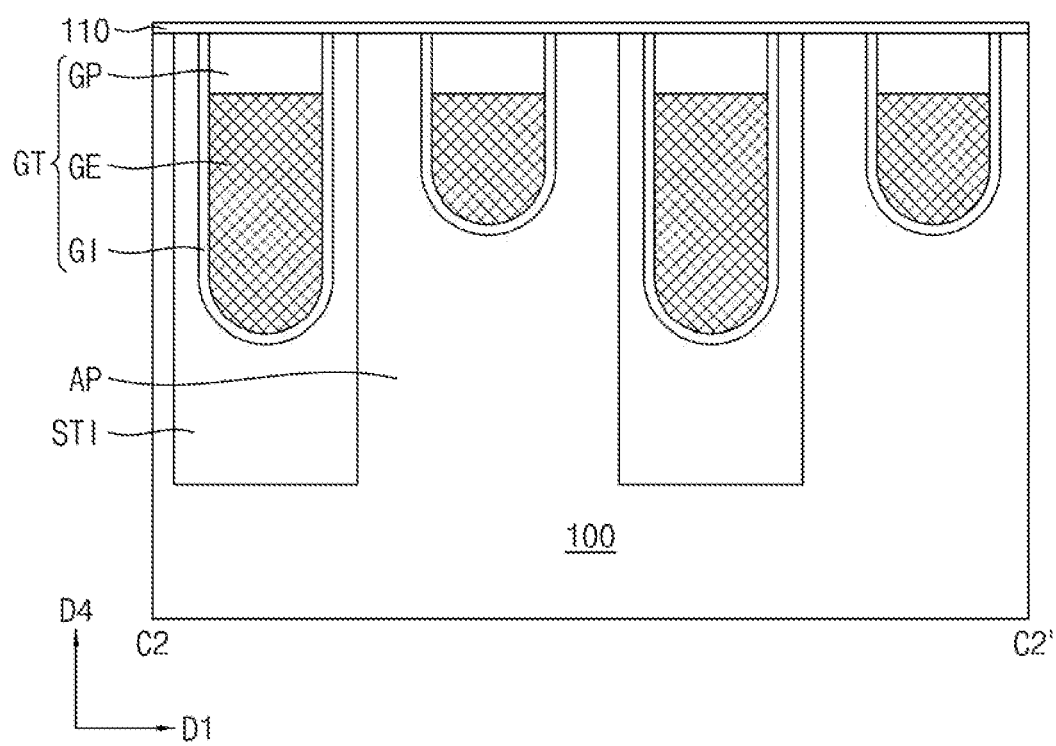
Figure 4A:
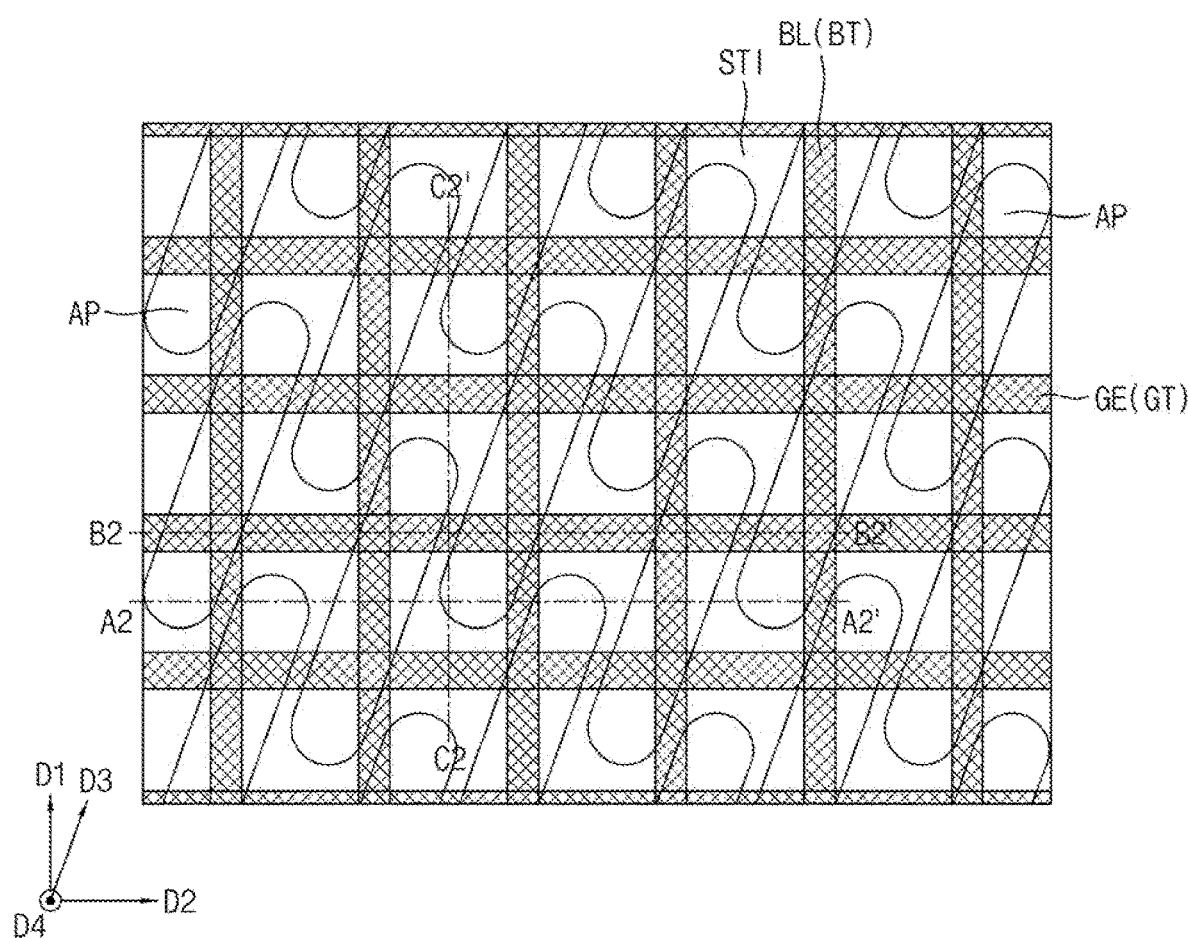
Figure 4B:
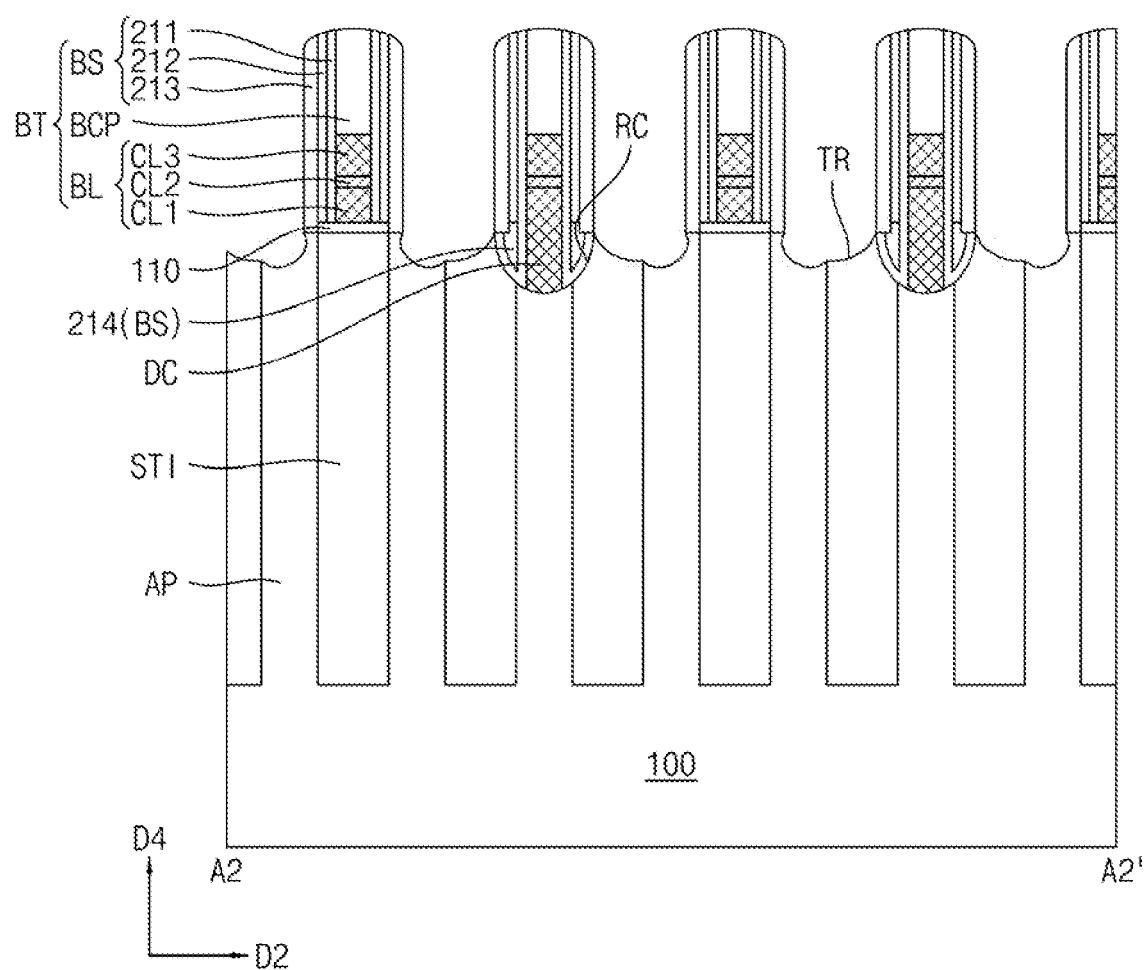
Figure 4C:
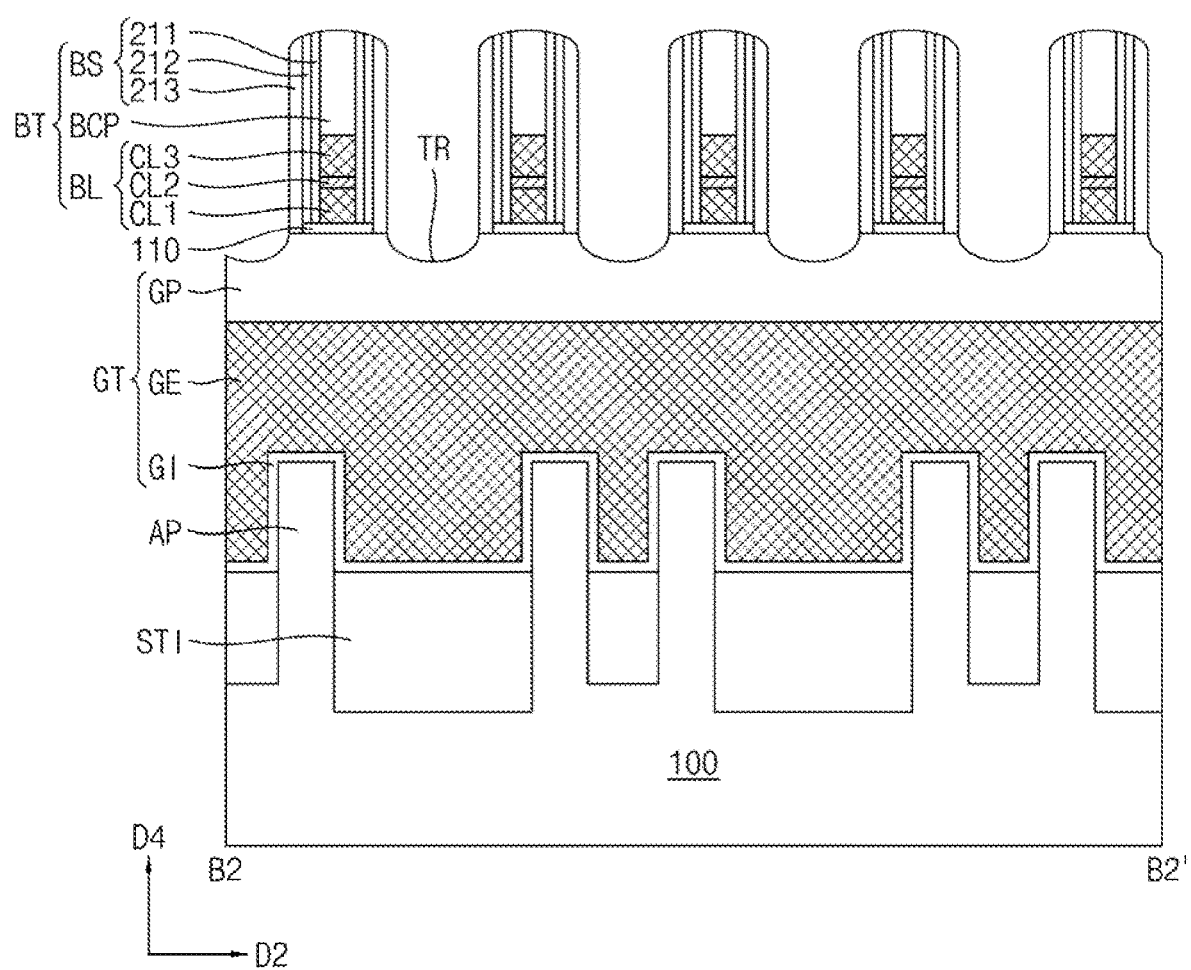
Figure 4D:
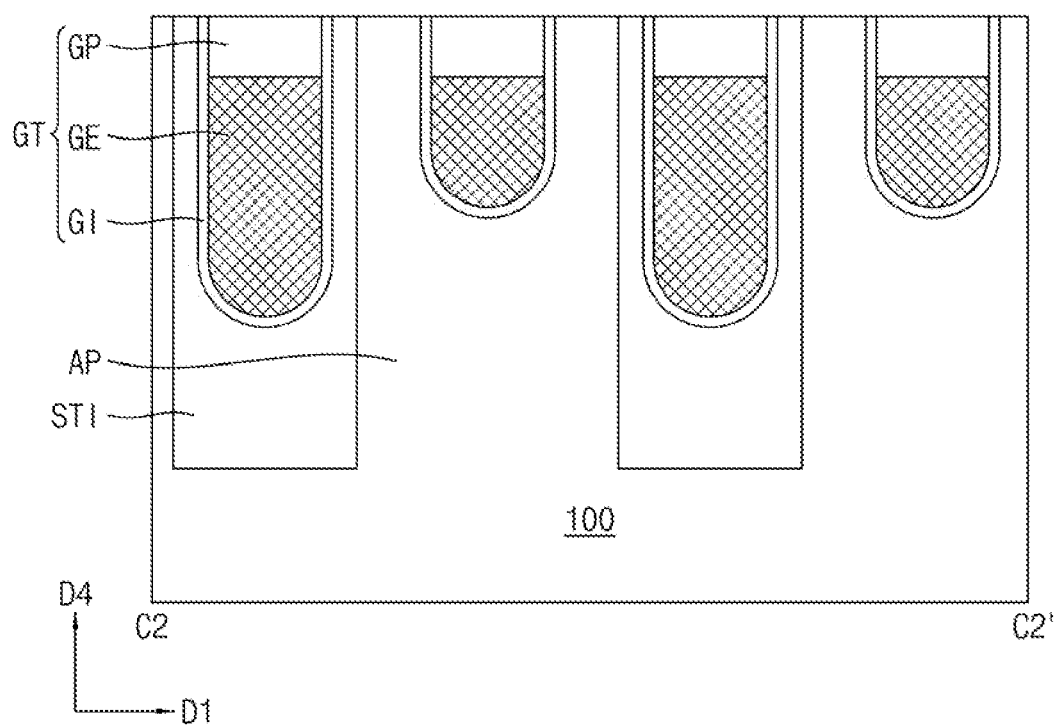

Referring to FIGS. 2A and 2B, a substrate 100 may be patterned, thereby forming active patterns AP. An element isolation layer STI may be formed in a space provided among the active patterns PA.

Referring to FIGS. 3A, 3B, 3C, and 3D, gate structures GT may be formed. Formation of the gate structure GT may include etching the active patterns AP and the element isolation layer STI, forming a gate insulating layer GI, forming a gate electrode GE, and forming a gate capping layer GP.

Thereafter, an interlayer insulating layer 110 covering the active patterns AP, the element isolation layer STI and the gate capping layers GP may be formed.

Referring to FIGS. 4A, 4B, 4C, and 4D, bit line structures BT may be formed. In an implementation, formation of the bit line structure BT may include forming a preliminary first conductive layer on the interlayer insulating layer 110, forming a recess RC extending through the preliminary first conductive layer and the interlayer insulating layer 110, thereby exposing a portion of the active pattern AP, forming a preliminary direct contact layer in the recess RC, forming a preliminary second conductive layer and a preliminary third conductive layer on the preliminary first conductive layer and the preliminary direct contact layer, forming a preliminary bit line capping layer on the preliminary third conductive layer, patterning the preliminary direct contact layer, the preliminary first conductive layer, the preliminary second conductive layer, the preliminary third conductive layer and the preliminary bit line capping layer, thereby forming a direct contact DC, a first conductive layer CL1, a second conductive layer CL2, a third conductive layer CL3 and a bit line capping layer BCP, and forming bit line spacers BS on side walls of the direct contact DC, the first conductive layer CL1, the second conductive layer CL2 and the bit line capping layer BCP.

The interlayer insulating layer 110, the gate capping layers GP, the active patterns AP, and the element isolation layer STI may be etched among the bit line structures BT and, as such, trenches TR may be formed.

Figure 5A:
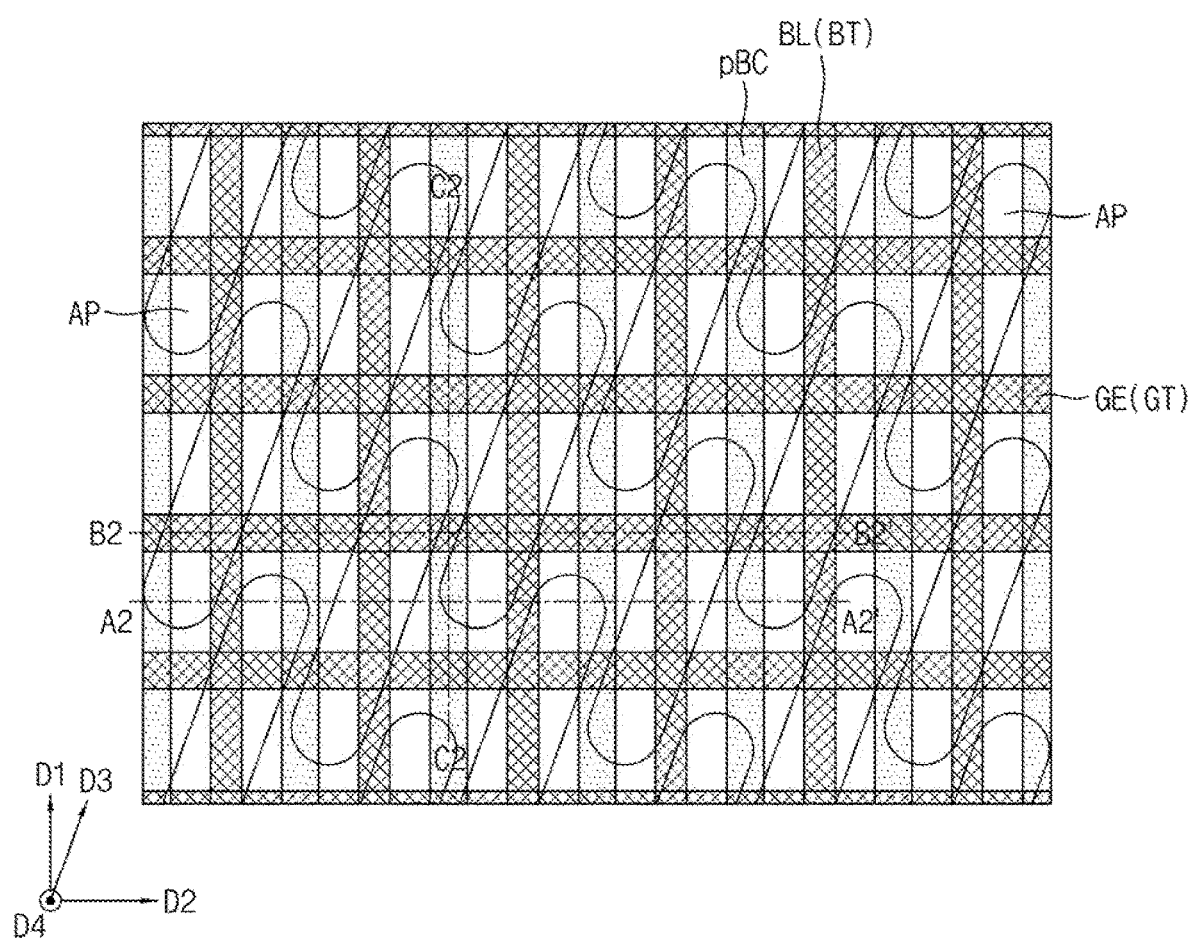
Figure 5B:
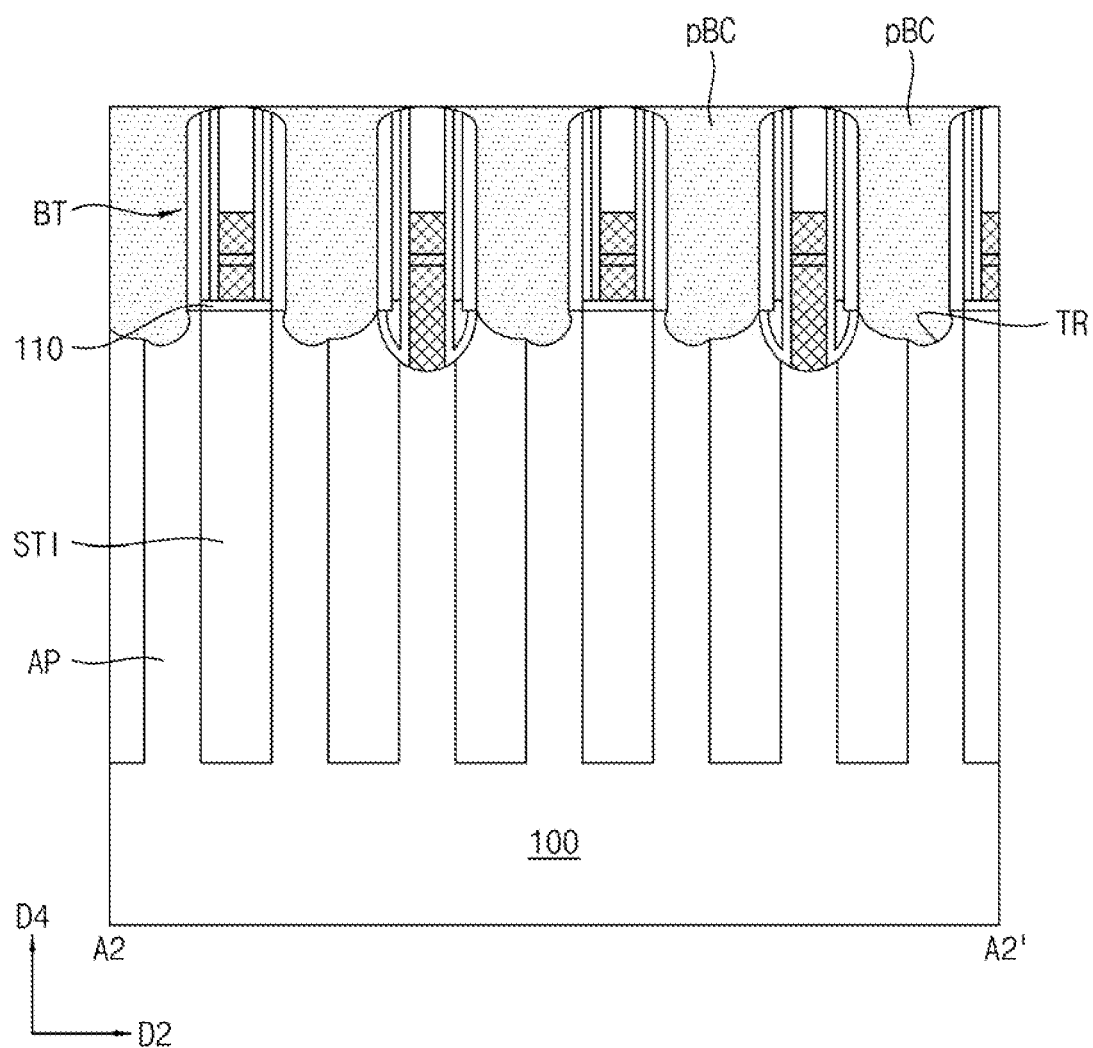
Figure 5C:
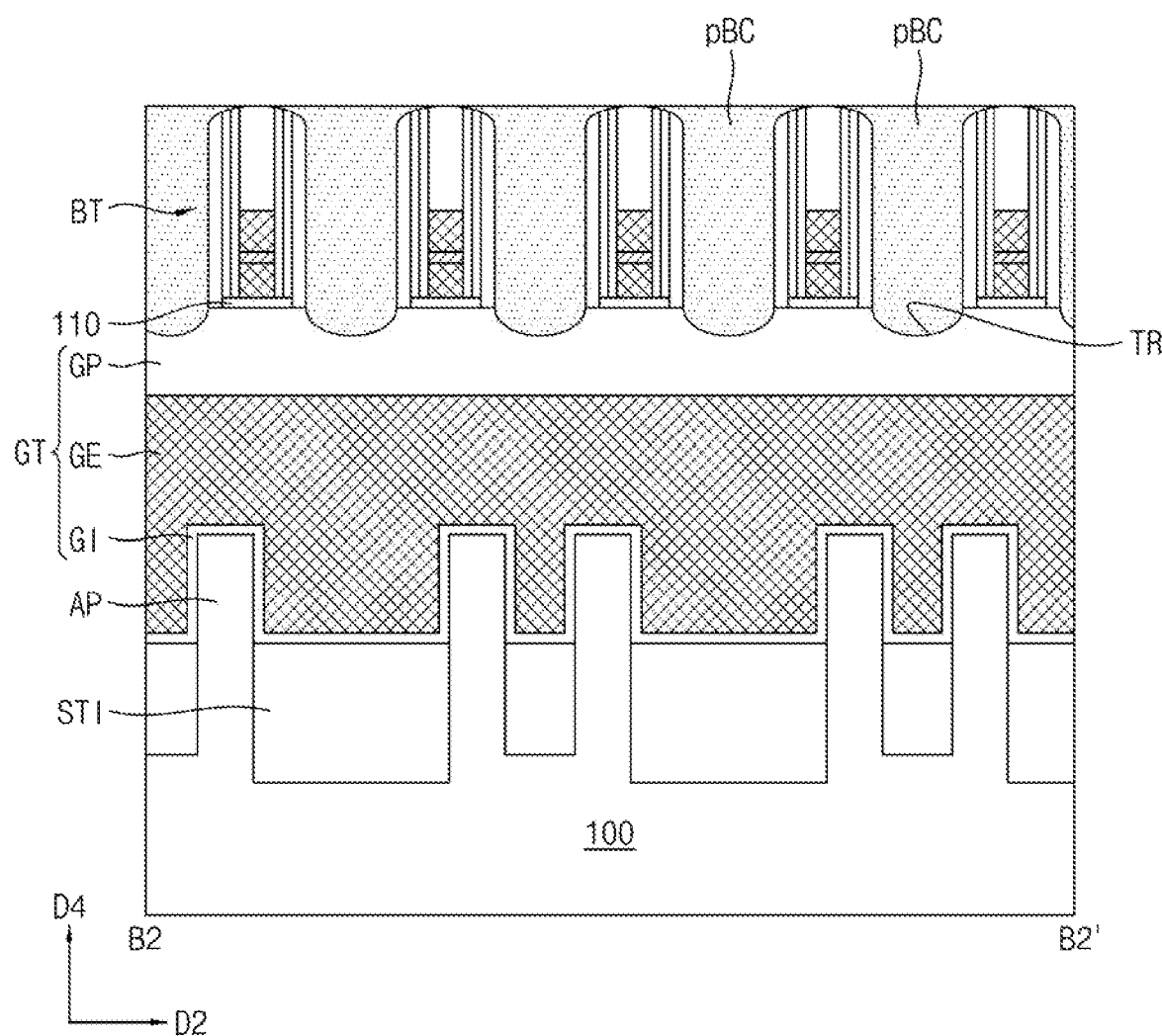
Figure 5D:
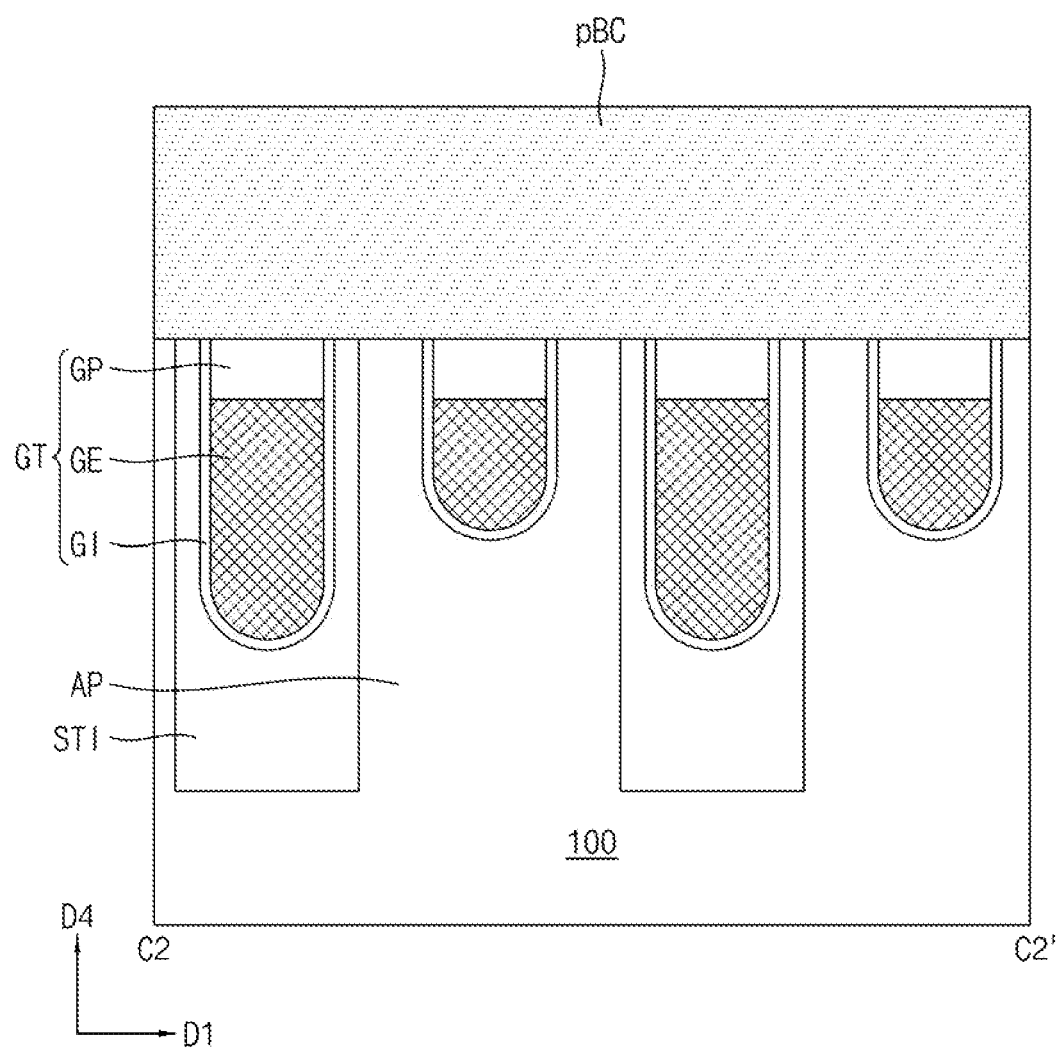
Figure 6A:
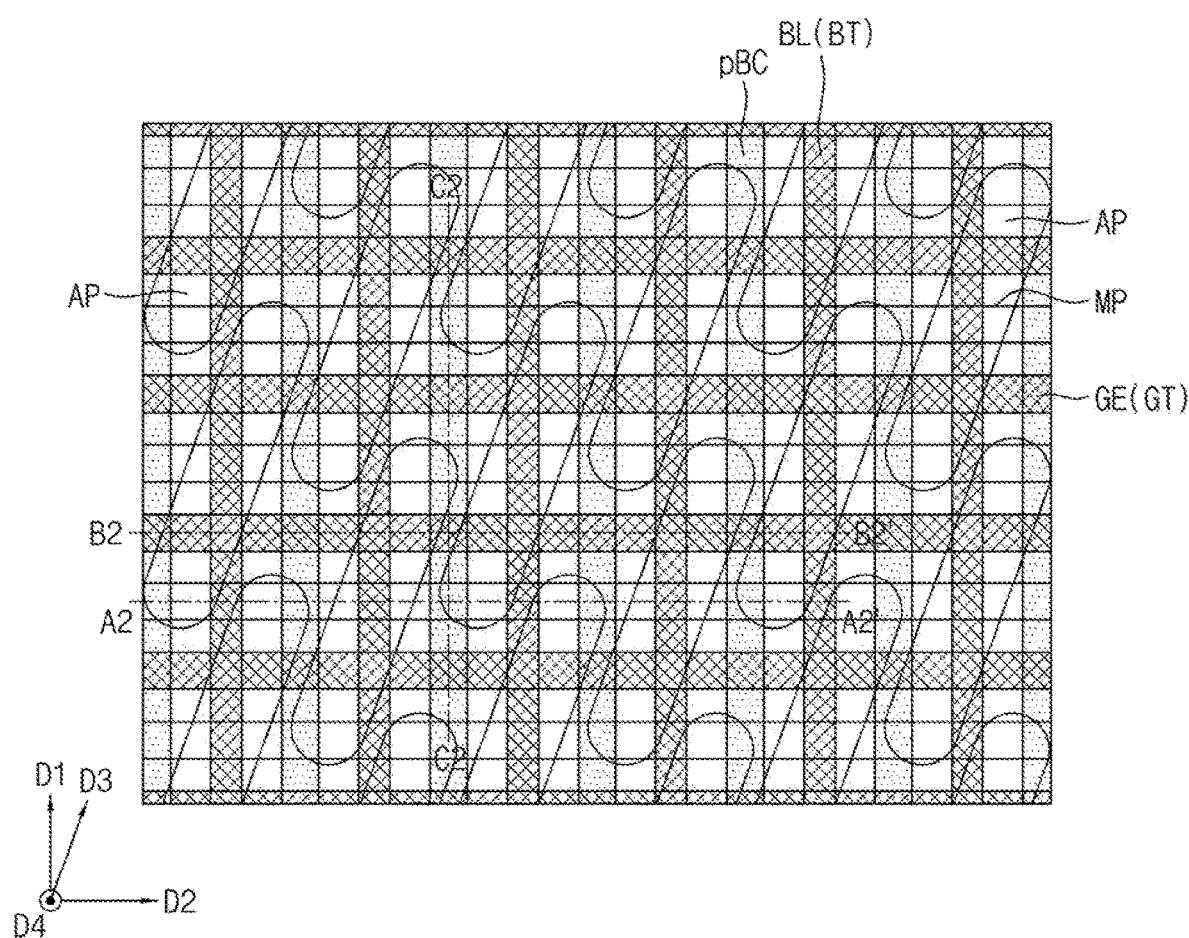
Figure 6B:
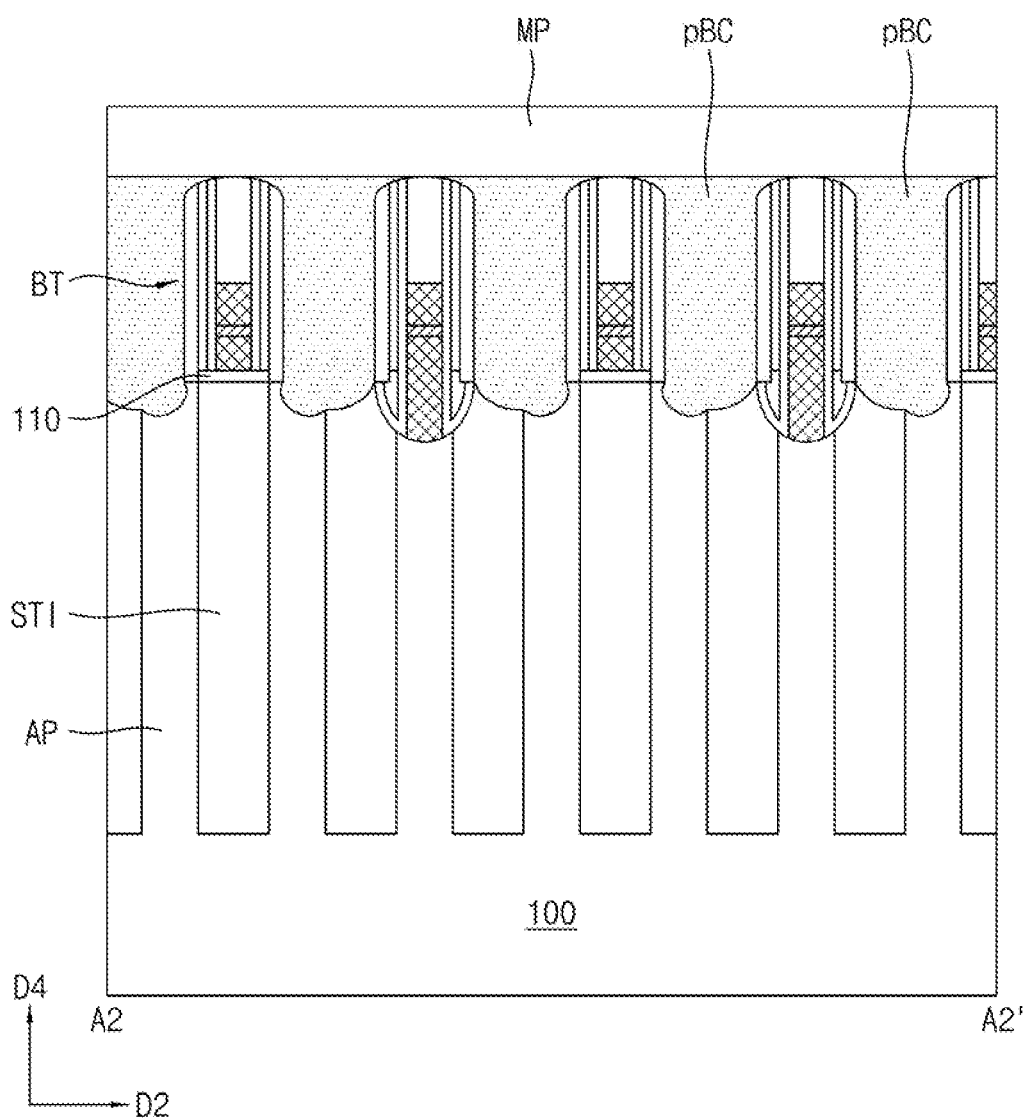
Figure 6C:
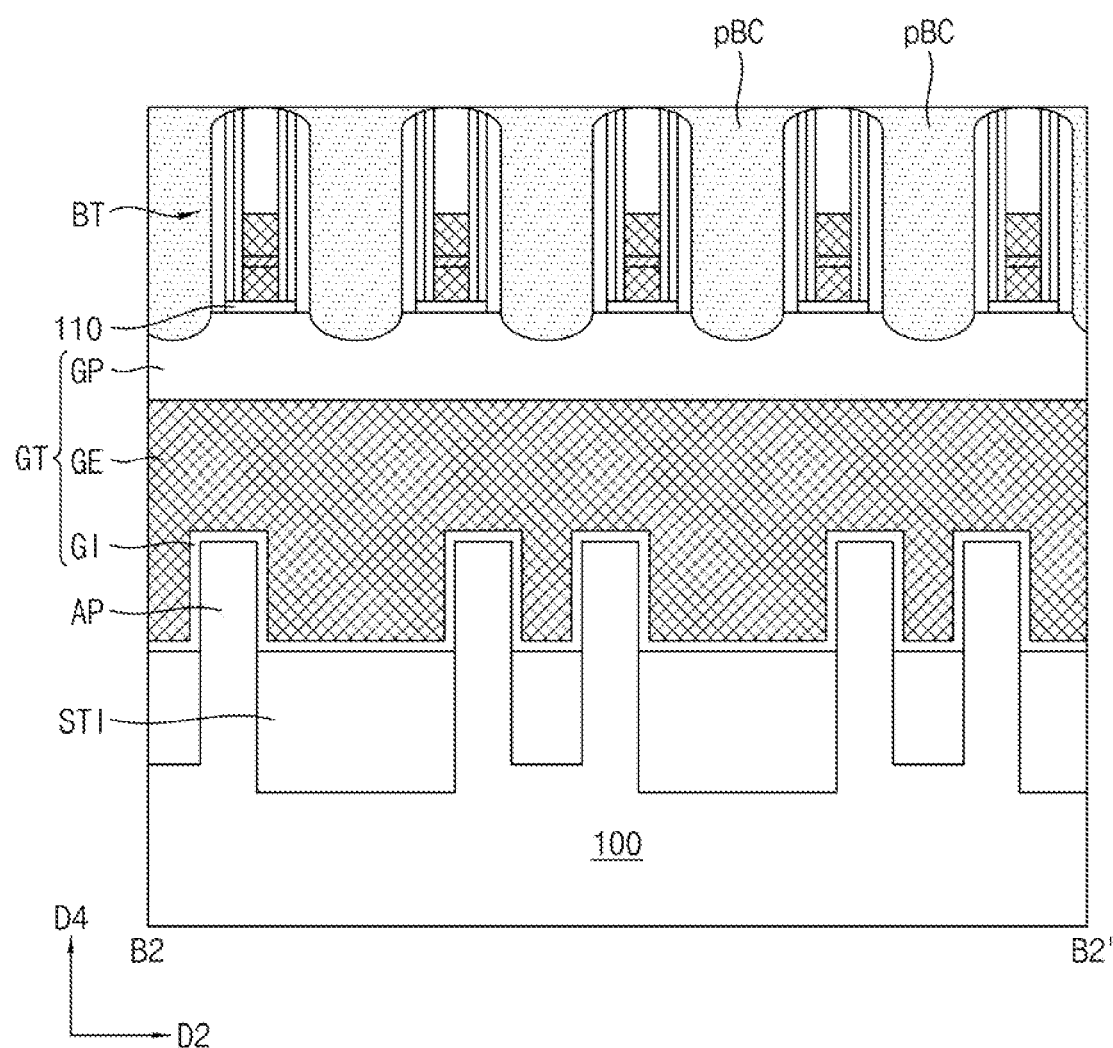
Figure 6D:
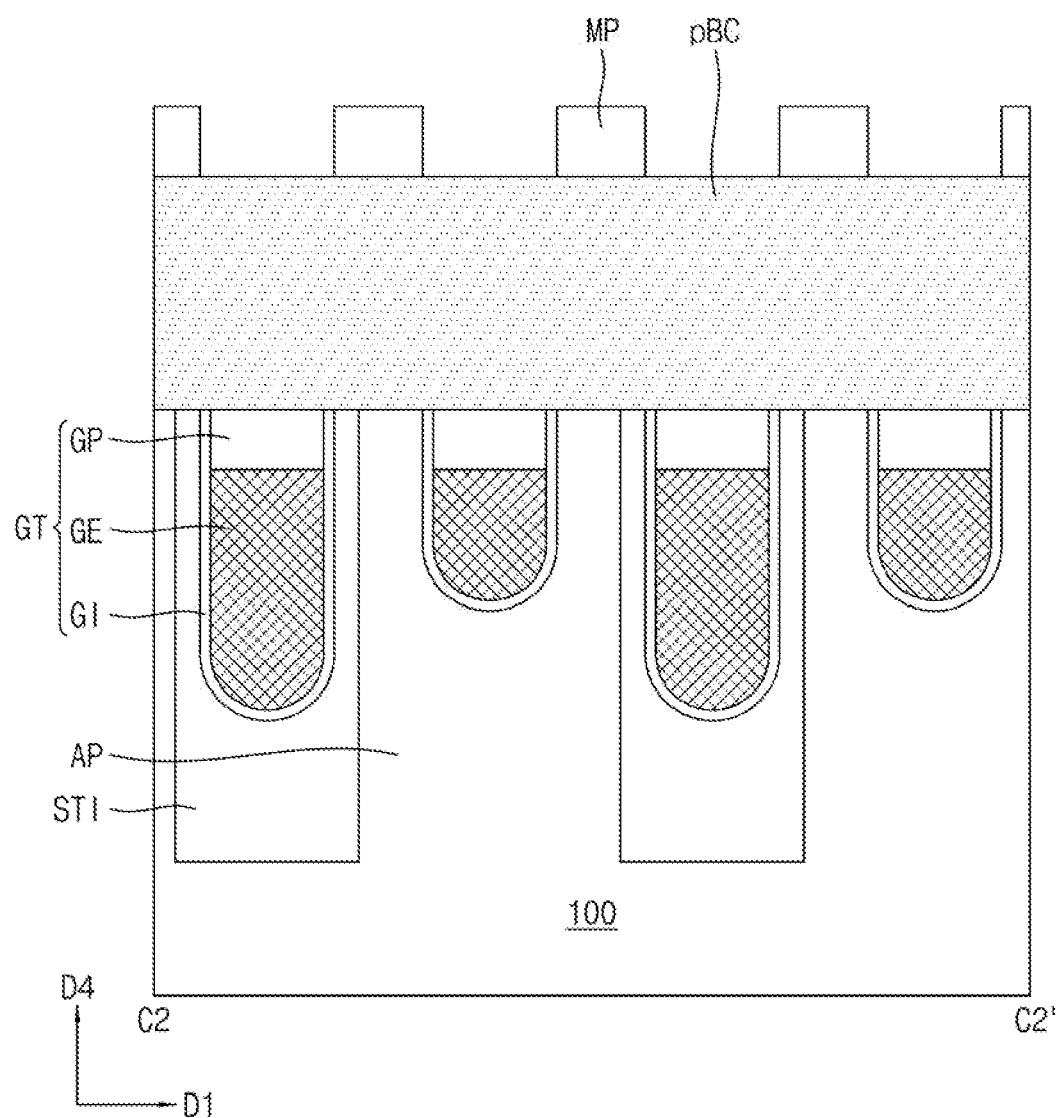
Figure 7A:
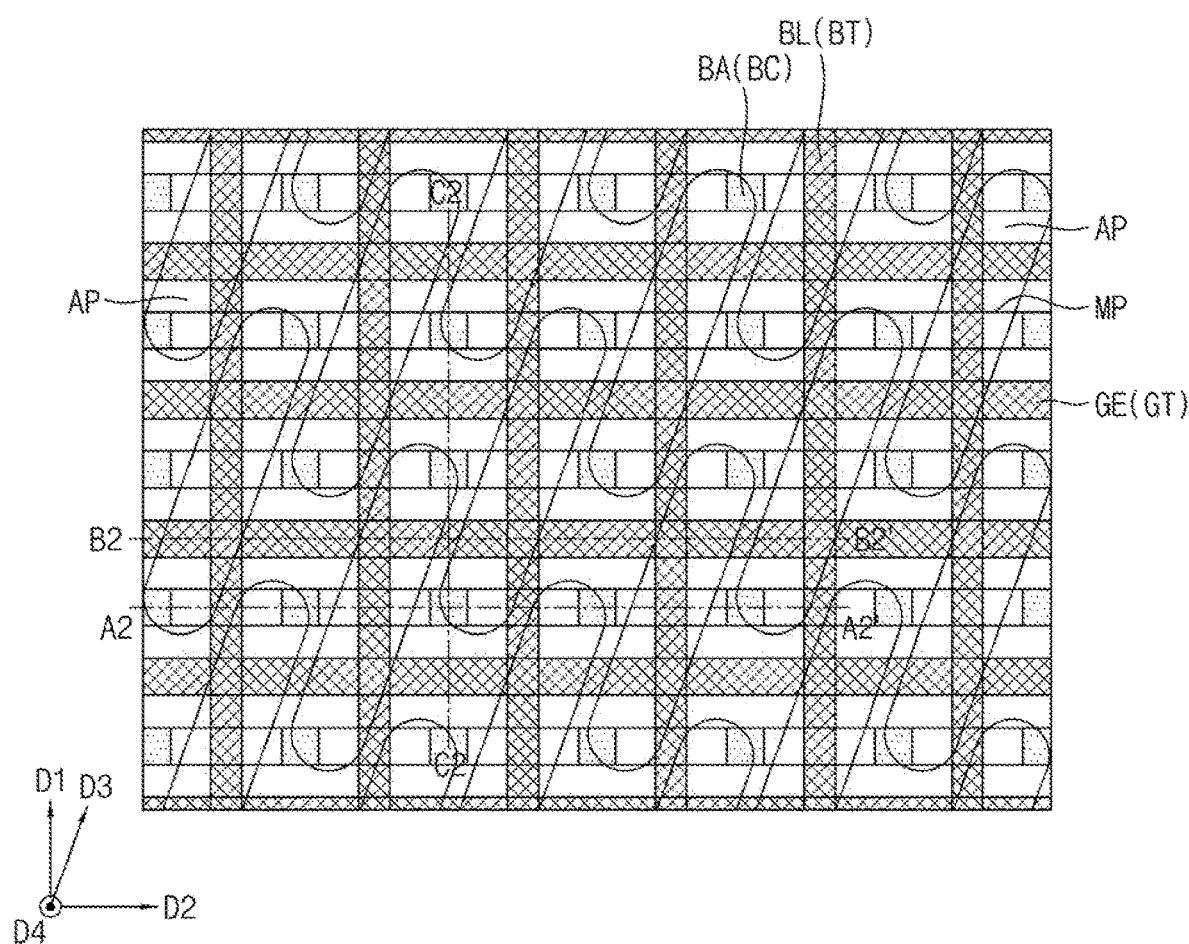
Figure 7B:
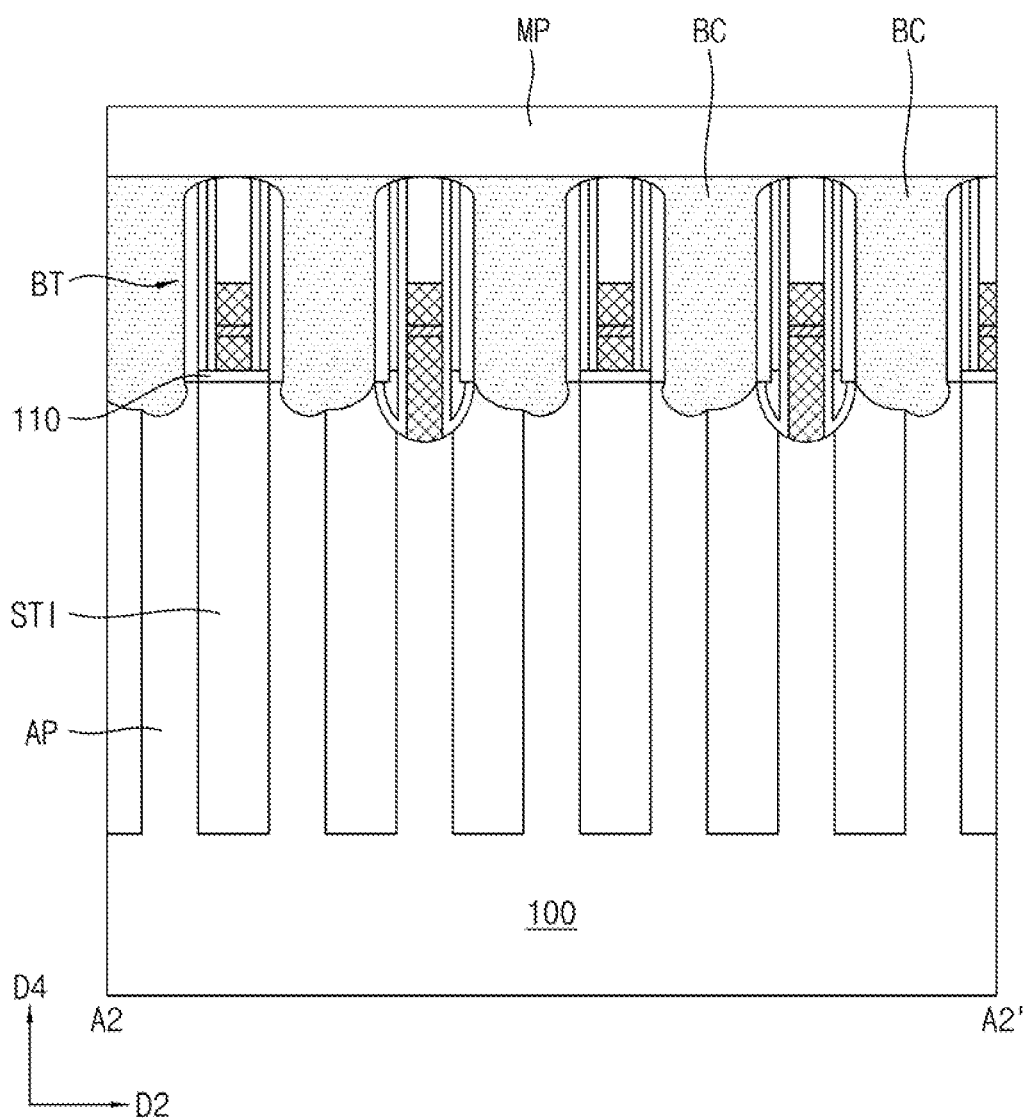
Figure 7C:
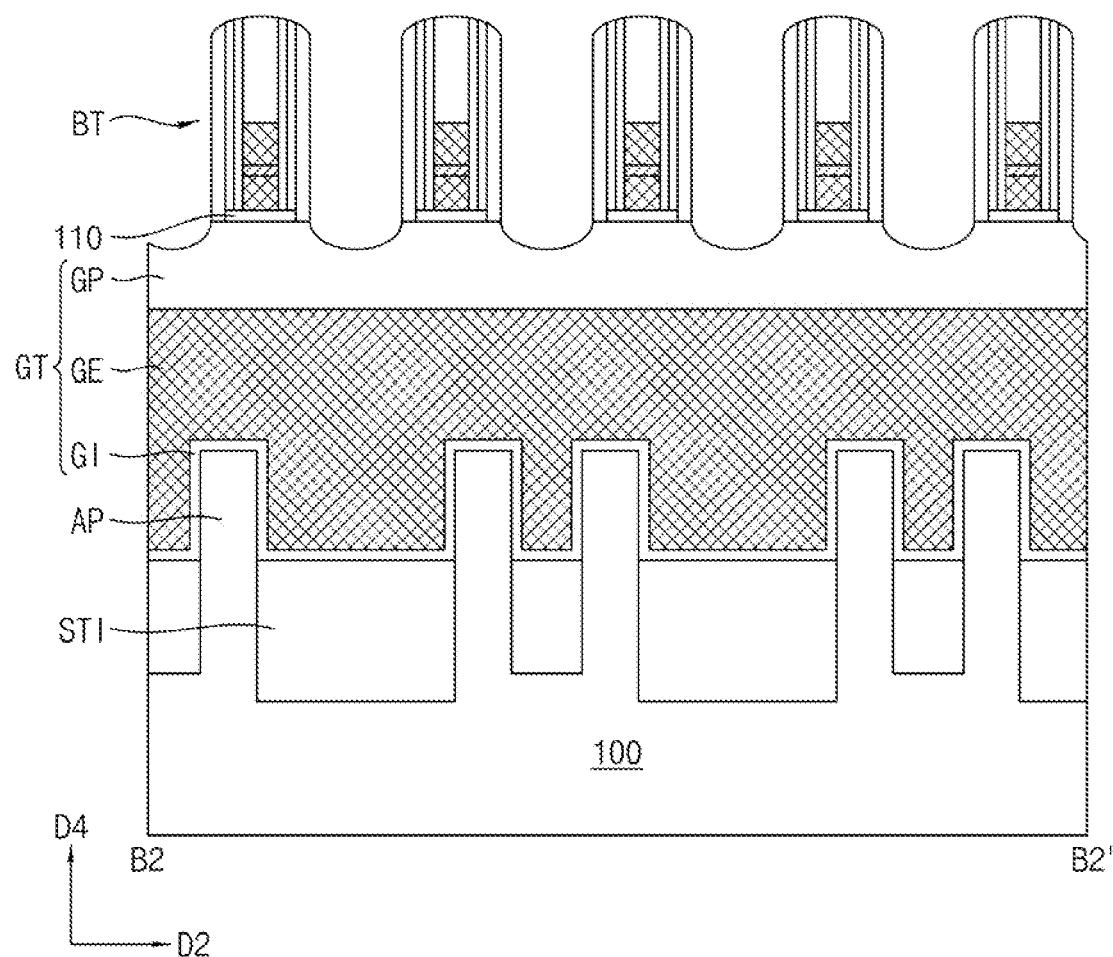
Figure 7D:
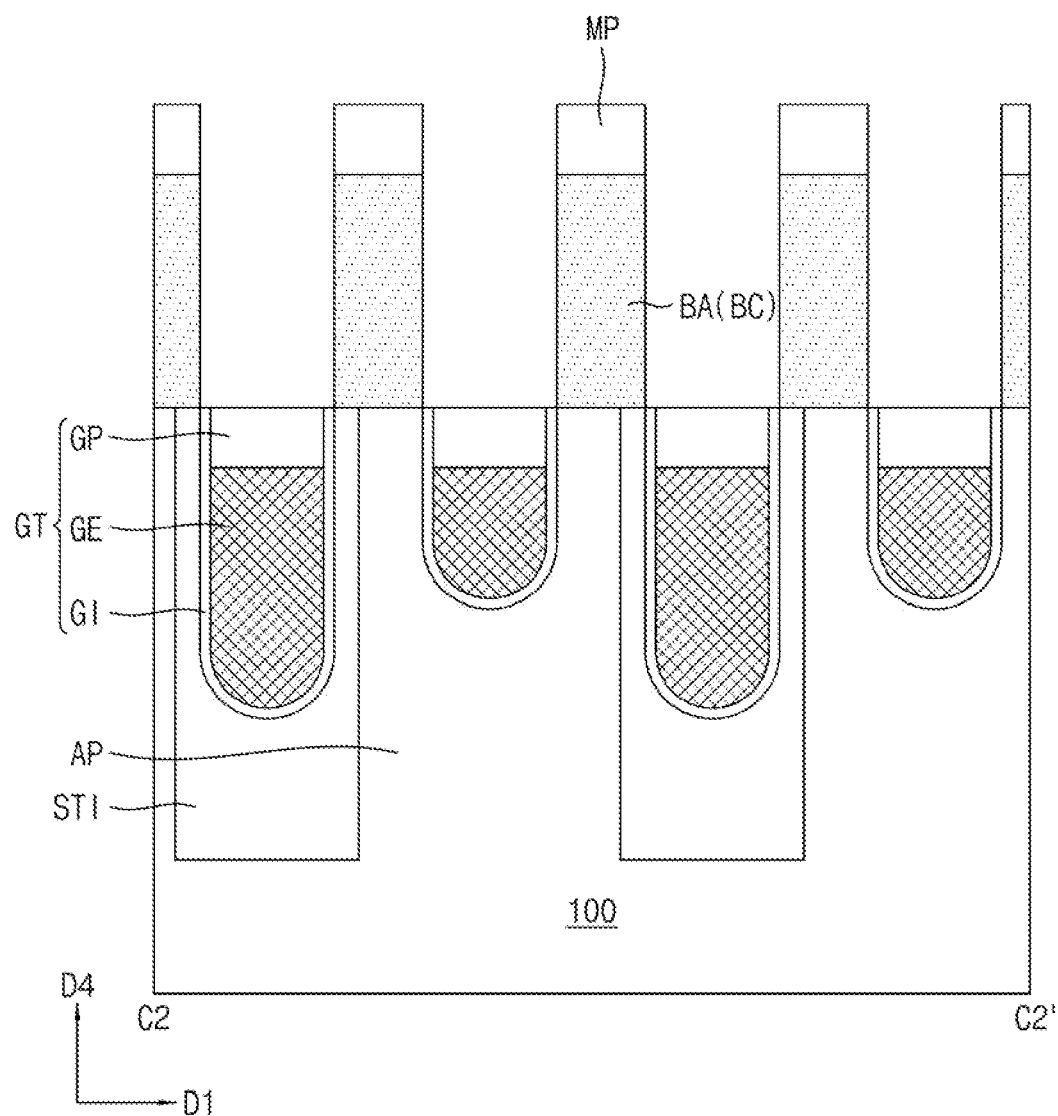

Referring to FIGS. 5A, 5B, and 5C, preliminary buried contact layers pBC may be formed. The preliminary buried contact layers pBC may be formed among the bit line structures BT, respectively. Each of the preliminary buried contact layers pBC may extend in a first direction D1. The preliminary buried contact layers pBC may be spaced apart from one another in a second direction D2. The preliminary buried contact layers pBC may fill the trenches TR, respectively. In an implementation, formation of the preliminary buried contact layers pBC may include forming a polysilicon layer through a deposition process, annealing the polysilicon layer, thereby forming a monocrystalline silicon layer, and removing an upper portion of the monocrystalline silicon layer.

Referring to FIGS. 6A, 6B, 6C, and 6D, mask patterns MP may be formed on the bit line structures BT and the preliminary contact layers pBC. The mask patterns MP may extend in the second direction D2. The mask patterns MP may be spaced apart from one another in the first direction D1. Portions of a top surface of the preliminary buried contact layer pBC may be exposed among or between the mask patterns MP. In an implementation, the mask patterns MP may be formed through a deposition process and an etching process. The mask patterns MP may include, e.g., an oxide.

Referring to FIGS. 7A, 7B, 7C, and 7D, the preliminary buried contact layers pBC may be etched using the mask patterns MP as an etch mask. As the preliminary buried contact layers pBC are etched, the preliminary buried contact layers pBC may be separated into buried contacts BC. In a state of being etched using the mask patterns MP as an etch mask, the buried contact BC may be defined as including only a base portion BA.

Figure 8A:
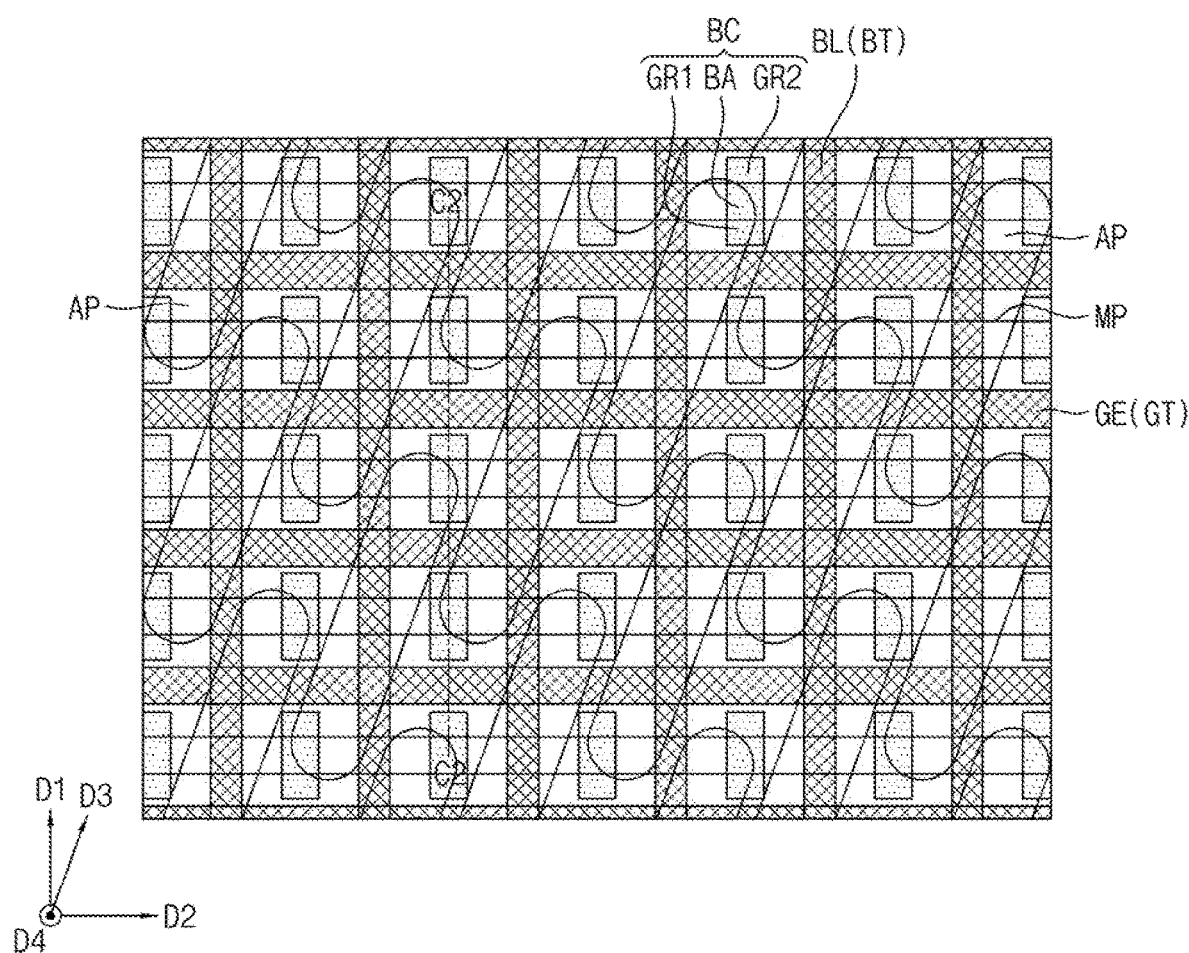
Figure 8B:
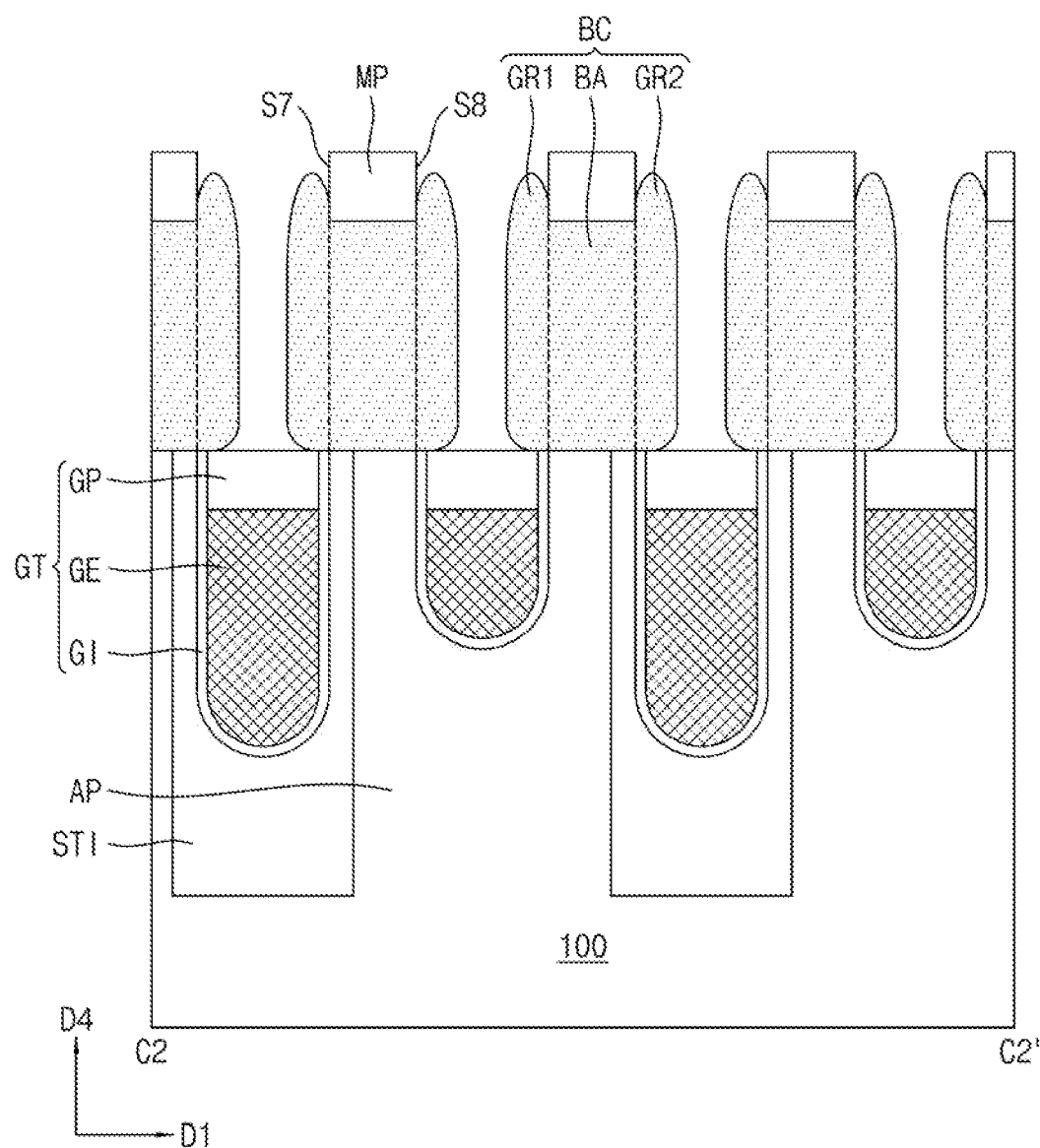

Referring to FIGS. 8A and 8B, a growth process of the buried contact BC may be performed. In an implementation, the growth process of the buried contact BC may be an epitaxial growth process. In accordance with the growth process of the buried contact BC, a first growth portion GR1 and a second growth portion GR2 of the buried contact BC may be formed. The first growth portion GR1 and the second growth portion GR2 may be grown from a side wall of the base portion BA.

The base portion BA may overlap with the mask pattern MP in a fourth direction D4. The first and second growth portions GR1 and GR2 may not overlap with the mask pattern MP in the fourth direction D4. Uppermost portions of the first and second growth portions GR1 and GR2 may be at a higher level than a top surface of the base portion BA. The uppermost portions of the first and second growth portions GR1 and GR2 may be at a higher level than a bottom surface of the mask pattern MP. The first growth portion GR1 may cover a lower portion of a first side surface S7 of the mask pattern MP, and the second growth portion GR2 may cover a lower portion of a second side surface S8 of the mask pattern MP.

Figure 9A:
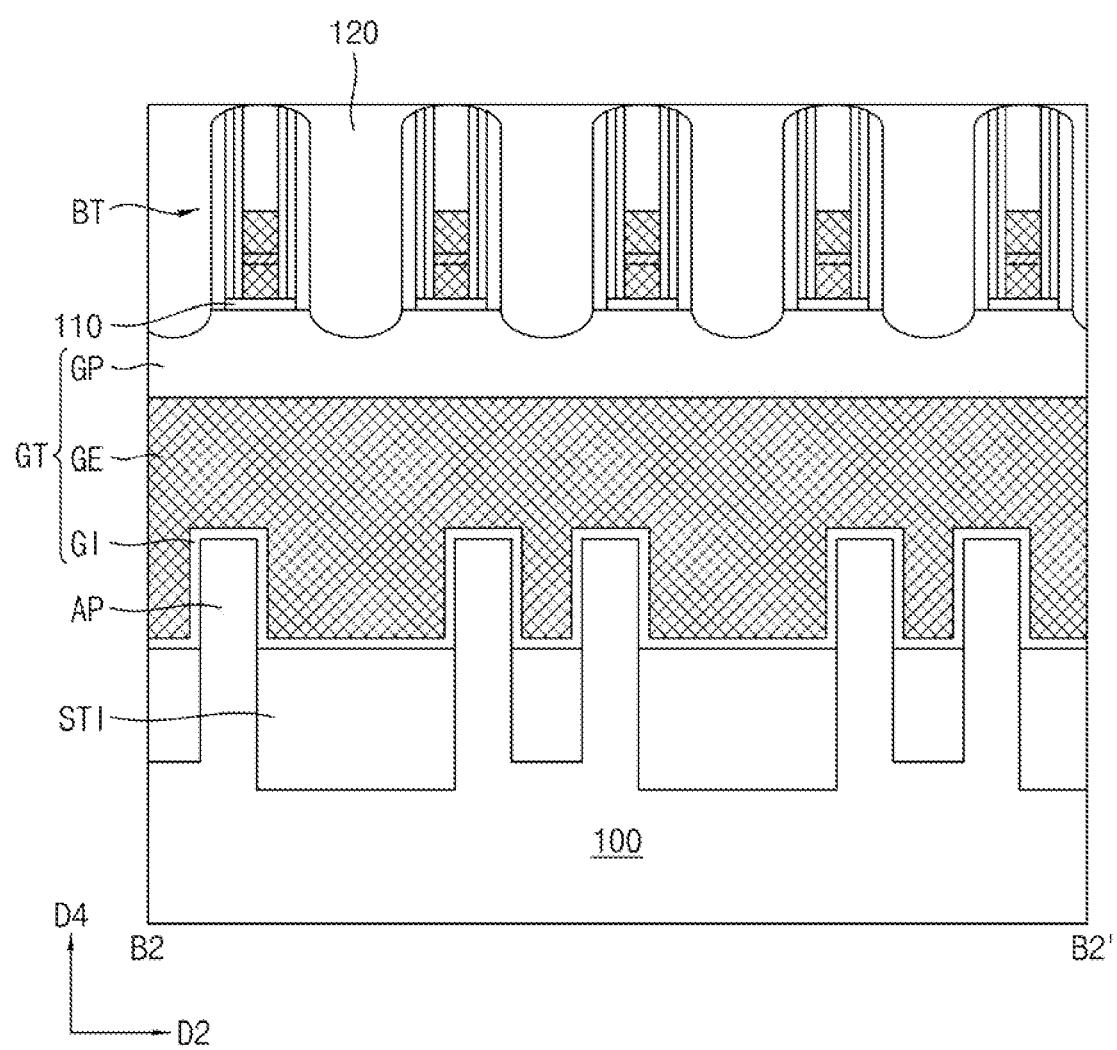
Figure 9B:
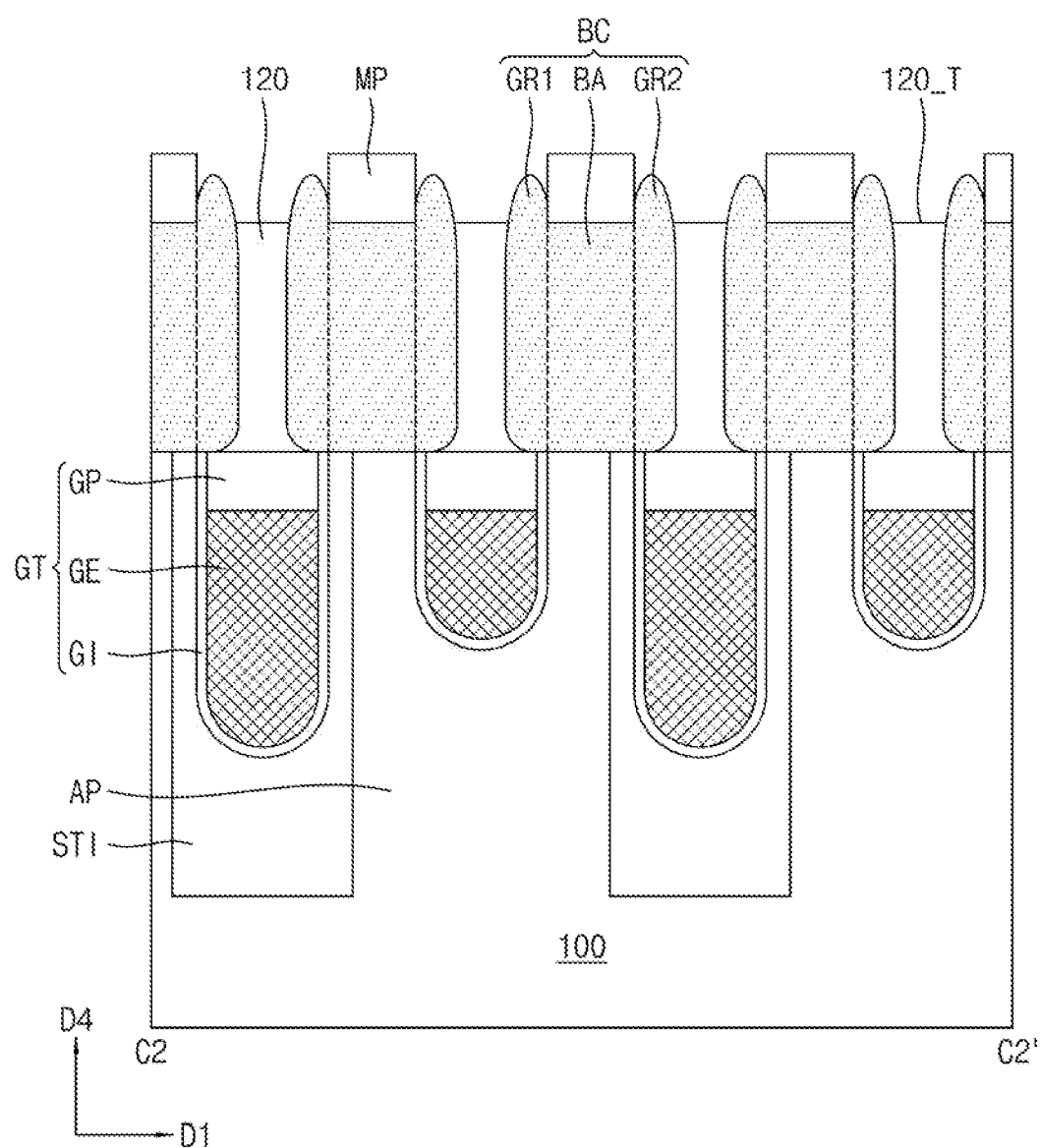

Referring to FIGS. 9A and 9B, insulating fences 120 may be formed. Formation of the insulating fences 120 may include forming an insulating fence material layer through a deposition process, and performing a process of etching the insulating fence material layer, thereby separating the insulating fence material layer into a plurality of insulating fences 120.

The etching process for separating the insulating fence material layer into the plurality of insulating fences 120 may be performed until the level of a top surface 120_T of the insulating fence 120 becomes lower than the level of the uppermost portion of the first growth portion GR1 and the level of the uppermost portion of the second growth portion GR2. An upper portion of the first growth portion GR1 and an upper portion of the second growth portion GR2 may be exposed to the outside of the insulating fences 120.

Figure 10A:
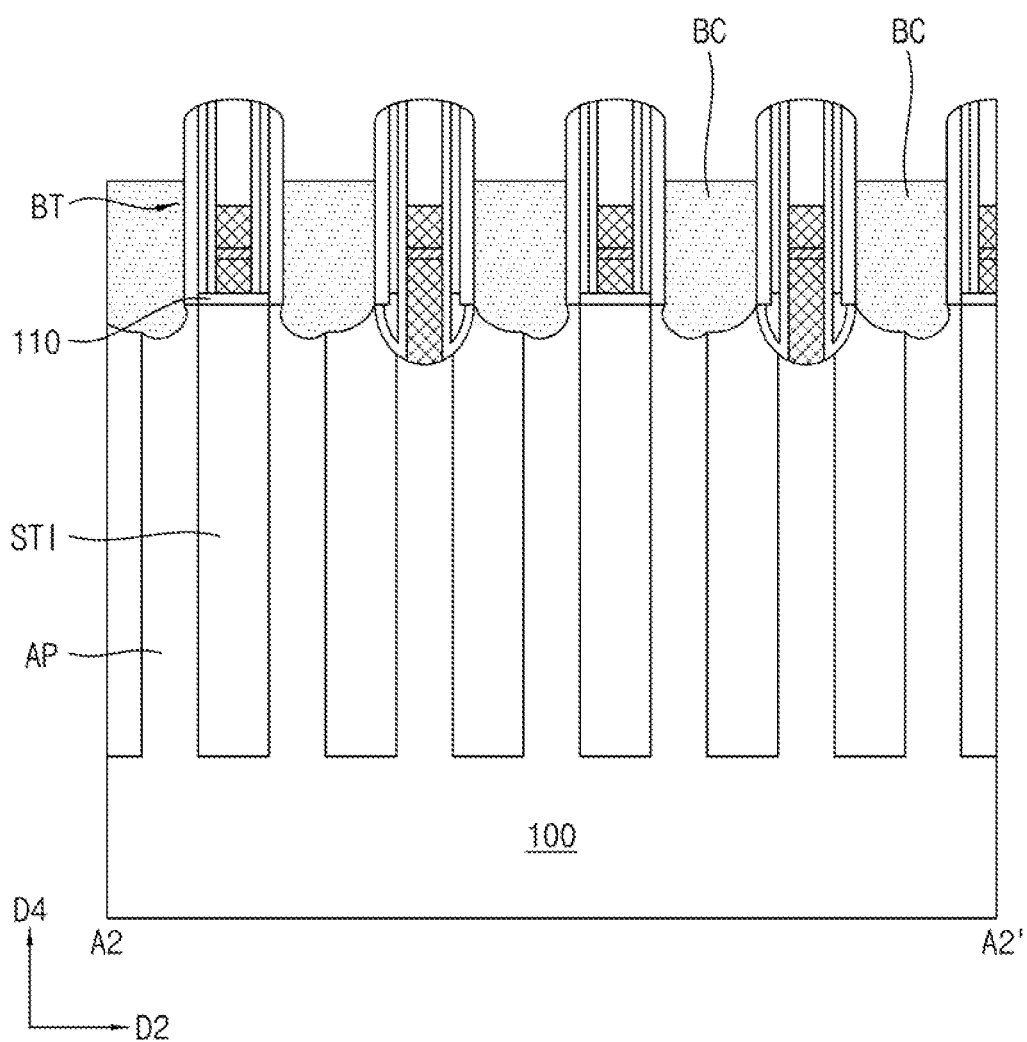
Figure 10B:
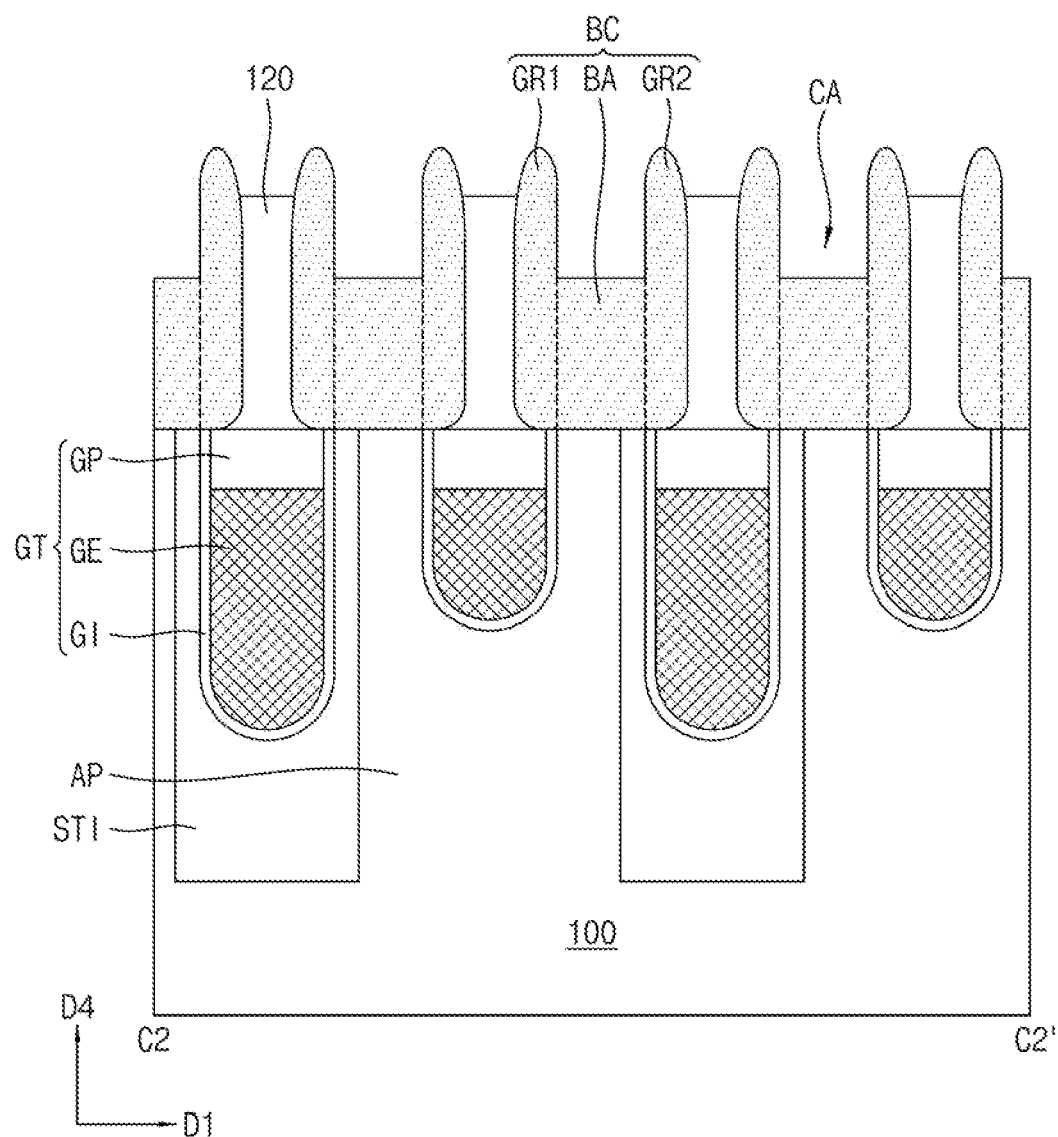

Referring to FIGS. 10A and 10B, the mask patterns MP may be removed.

Subsequently, a process of etching the grown buried contacts BC may be performed. In accordance with the process of etching the buried contacts BC, an upper portion of the base portion BA, the upper portion of the first growth portion GR1, and the upper portion of the second growth portion GR2 may be removed.

An empty space defined by the base portion BA, the first growth portion GR1 and the second growth portion GR2 may be defined as a cavity CA. The cavity CA may be defined by a top surface of the base portion BA, an inner side surface of the first growth portion GR1 and an inner side surface of the second growth portion GR2. The cavity CA may be defined between the first and second growth portions GR1 and GR2. The cavity CA may be defined on the base portion BA. An empty space at a lower level than the uppermost portions of the first and second growth portions GR1 and GR2 may be defined as the cavity CA.

Figure 11A:
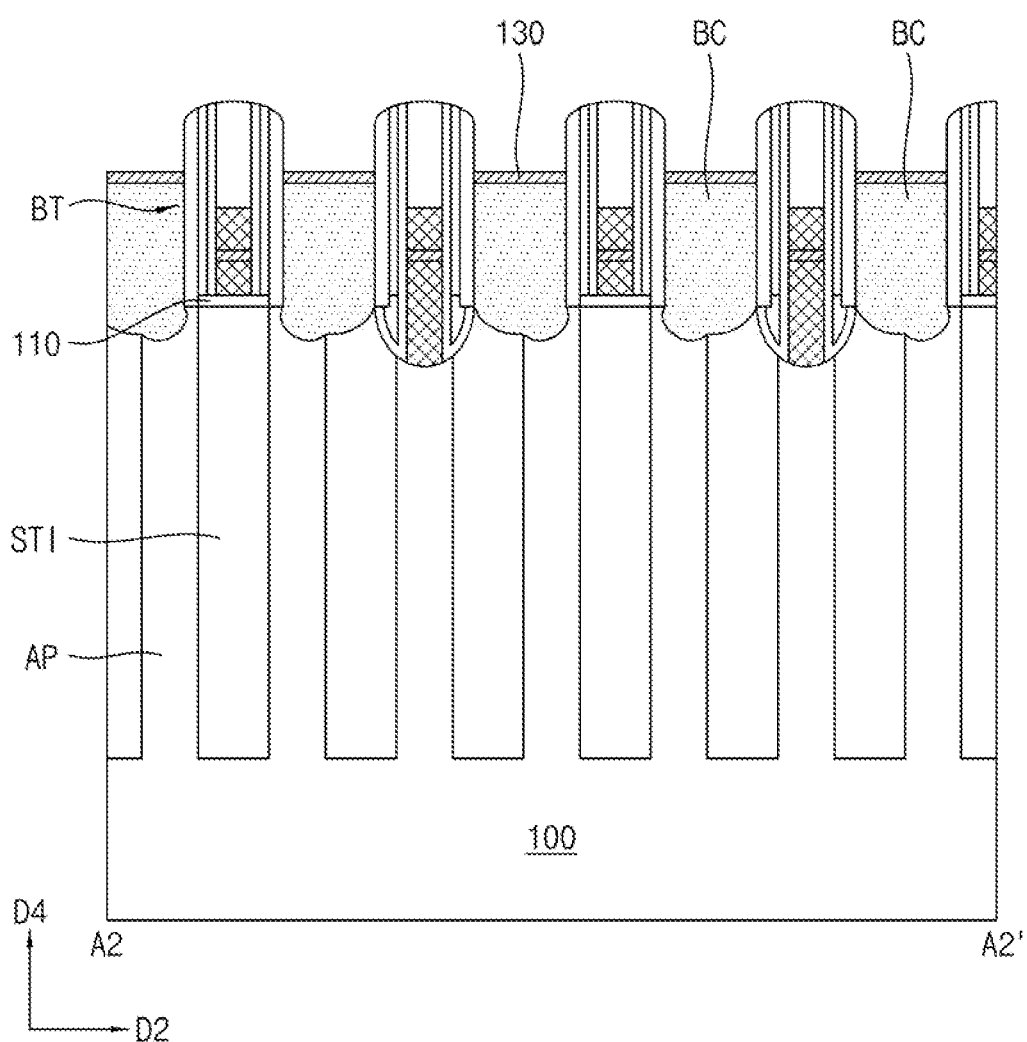
Figure 11B:
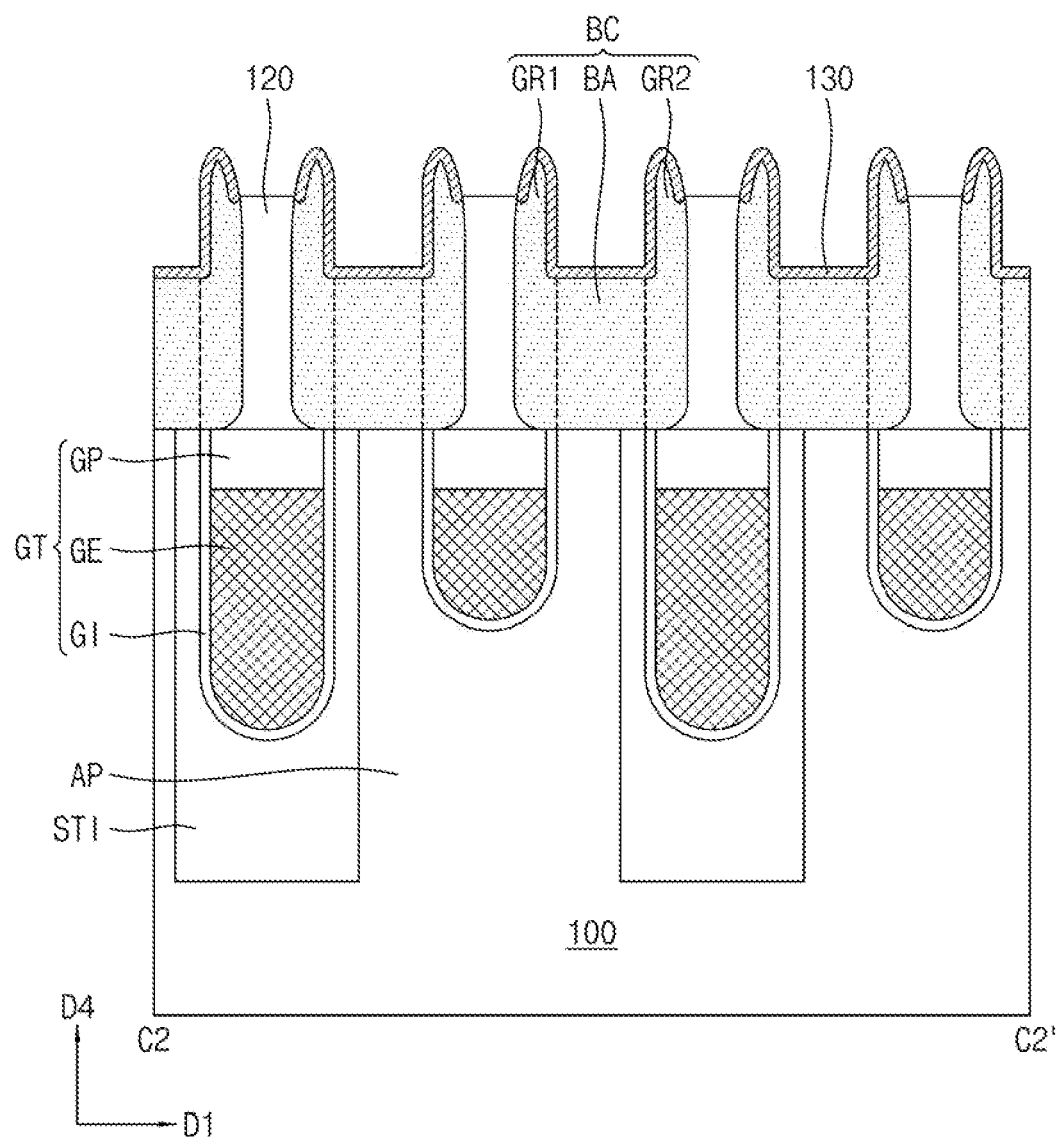

Referring to FIGS. 11A and 11B, contact patterns 130 may be formed. In an implementation, the contact patterns 130 may be formed by performing a process of depositing a metal material, and then performing a thermal treatment process. The contact pattern 130 may fill a portion of the cavity CA. The contact pattern 130 may cover the base portion BA, the first growth portion GR1 and the second growth portion GR2 of the buried contact BC.

Referring to FIGS. 1A, 1B, 1D, and 1E, landing pads LP and an insulating structure IS may be formed. Formation of the landing pads LP and the insulating structure IS may include forming a landing pad material layer, and forming an insulating structure IS, thereby separating the landing pad material layer into landing pads LP. A portion of the landing pad LP filling the cavity CA may be defined as an interposition portion IN.

A capacitor structure CT may be formed. Formation of the capacitor structure CT may include forming lower electrodes LE on the landing pads LP, respectively, forming a capacitor insulating layer CI covering the lower electrodes LE, and forming an upper electrode UE.

The semiconductor device manufacturing method according to the exemplary embodiments may include forming the first and second growth portions GR1 and GR2 through growth of the buried contact BC and, as such, may relatively increase the surface area of the buried contact BC. Accordingly, even when an etching time is lengthened in a process of etching the preliminary buried contact layer pBC, a sufficient surface area of the buried contact BC may be secured.

Figure 12A:
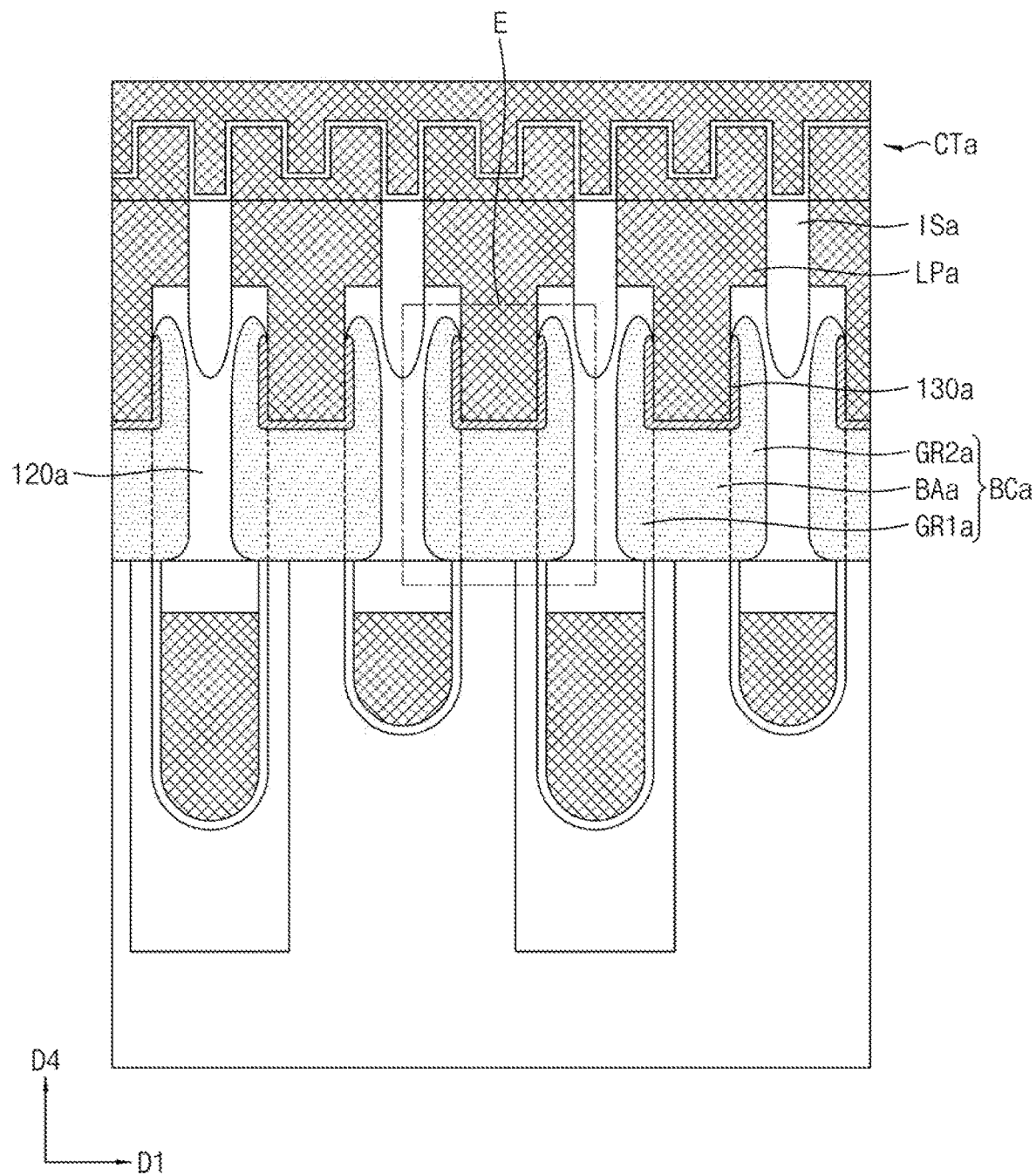
FIG. 12A is a cross-sectional view of a semiconductor device according to some exemplary embodiments of the disclosure.
Figure 12B:
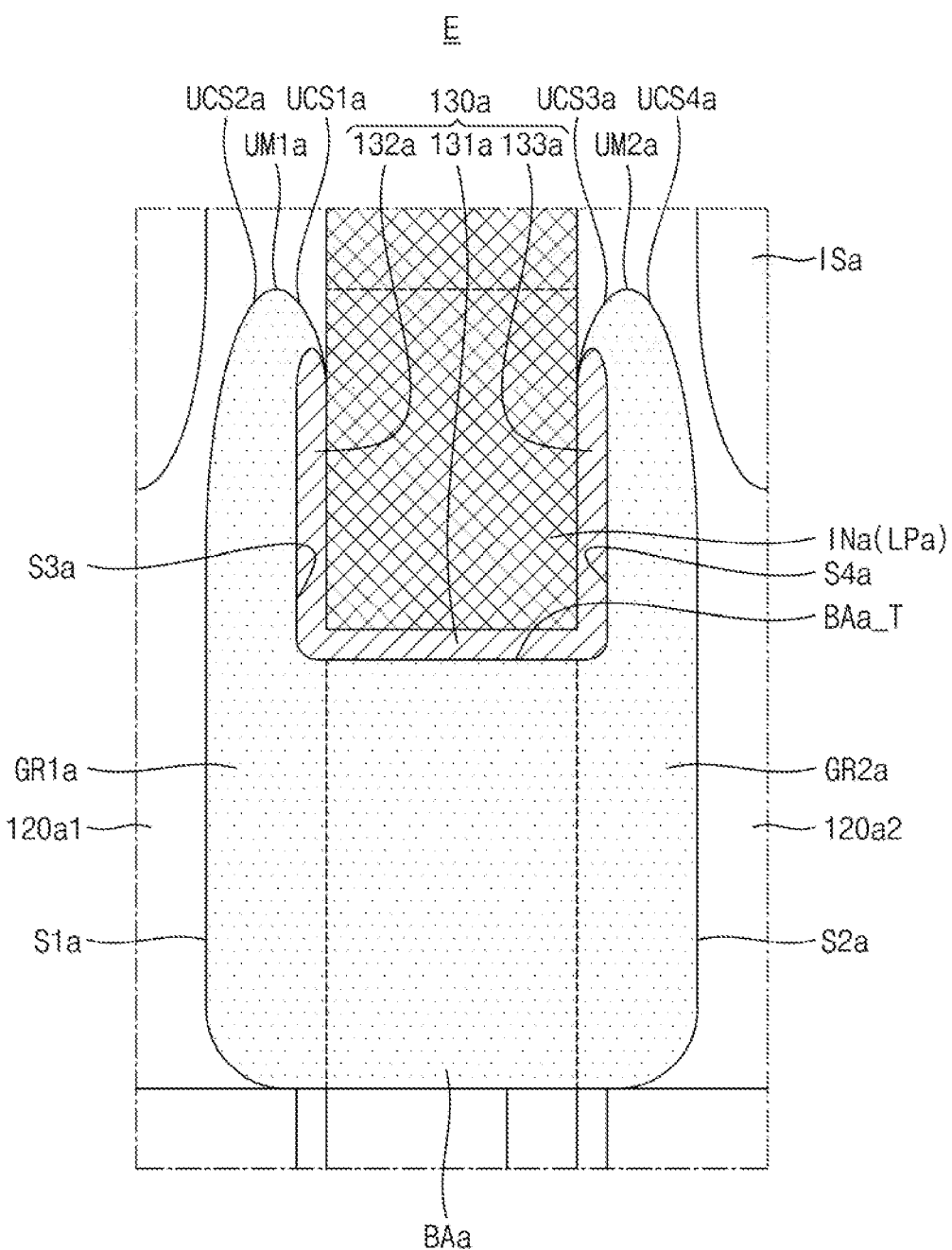
FIG. 12B is an enlarged view of a portion E of FIG. 12A.

FIG. 12A is a cross-sectional view of a semiconductor device according to some exemplary embodiments of the disclosure. FIG. 12B is an enlarged view of a portion E of FIG. 12A.

Referring to FIGS. 12A and 12B, each of buried contacts BCa may include a base portion BAa, a first growth portion GR1a, and a second growth portion GR2a. Contact patterns 130a may be on the buried contacts BCa. Landing pads LPa may be on the contact patterns 130a. Insulating fences 120a may be among or between the buried contacts BCa. The landing pads LPa may be separated from one another by an insulating structure Isa. A capacitor structure CTa may be on the landing pads LPa.

The contact pattern 130a may include a first portion 131a contacting a top surface BAa_T of the base portion BAa, a second portion 132a contacting an inner side surface S3a of the first growth portion GR1a, and a third portion 133a contacting an inner side surface S4a of the second growth portion GR2a. The contact pattern 130a may be spaced apart from an uppermost portion UM1a of the first growth portion GR1a. The contact pattern 130a may be spaced apart from an uppermost portion UM2a of the second growth portion GR2a.

The insulating fences 120a may include a first insulating fence 120a1 and a second insulating fence 120a2 (e.g., adjacent to or aligned with each other). The first insulating fence 120a1 may cover an outer side surface S1a, a second upper curved surface UCS2a, the uppermost portion UM1a and a first upper curved surface UCS1a of the first growth portion GR1a in the buried contact BCa between the first and second insulating fences 120a1 and 120a2. The second insulating fence 120a2 may cover an outer side surface S2a, a fourth upper curved surface UCS4a, the uppermost portion UM2a and a third upper curved surface UCS3a of the second growth portion GR2a in the buried contact BCa between the first and second insulating fences 120a1 and 120a2.

The landing pads LPa may include an interposition portion INa between the first and second growth portions GR1a and GR2a of the buried contact BCa.

Figure 13:
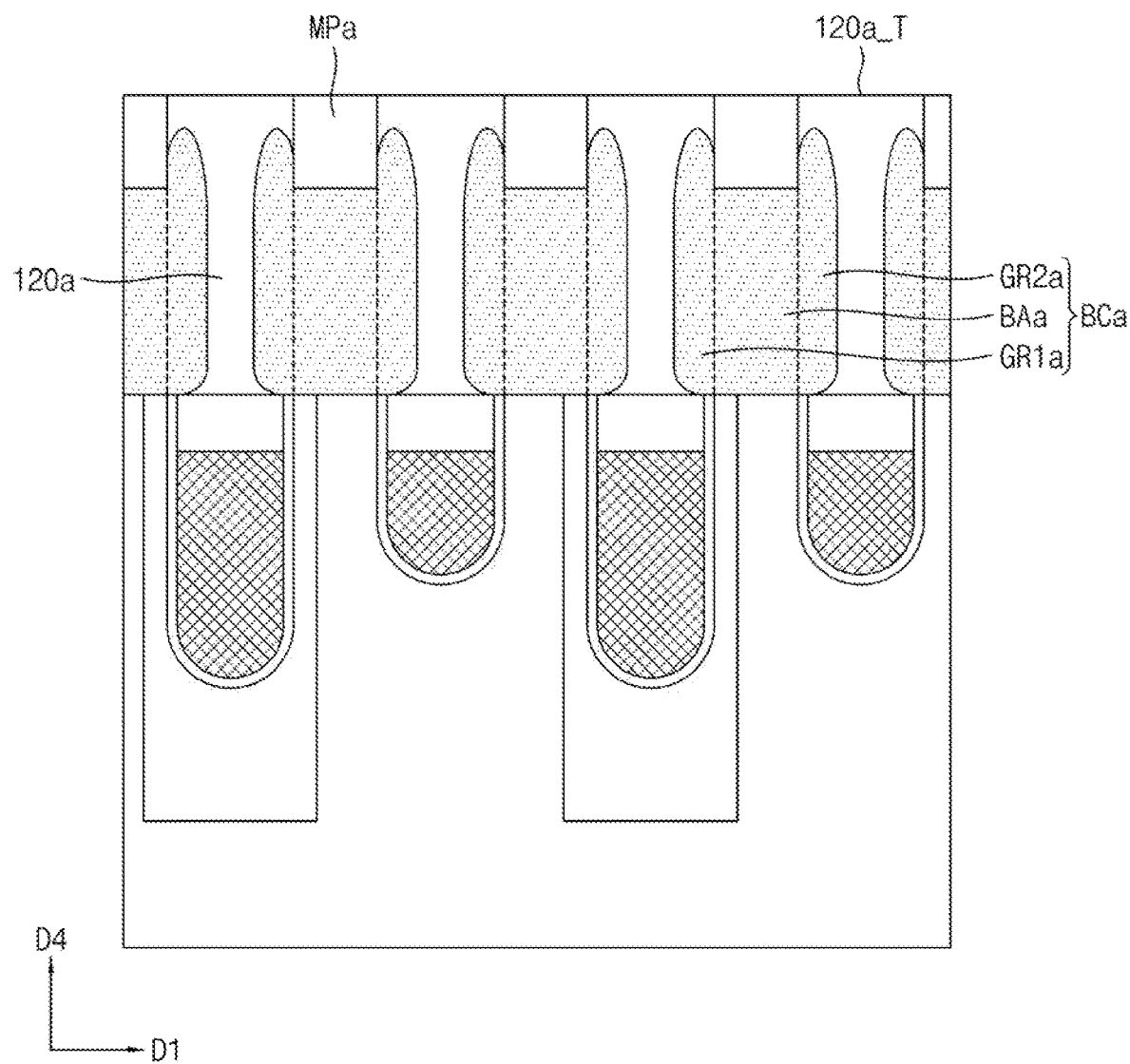
FIGS. 13, 14, and 15 are cross-sectional views of stages in a method for manufacturing a semiconductor device according to FIGS. 12A and 12B.
Figure 14:
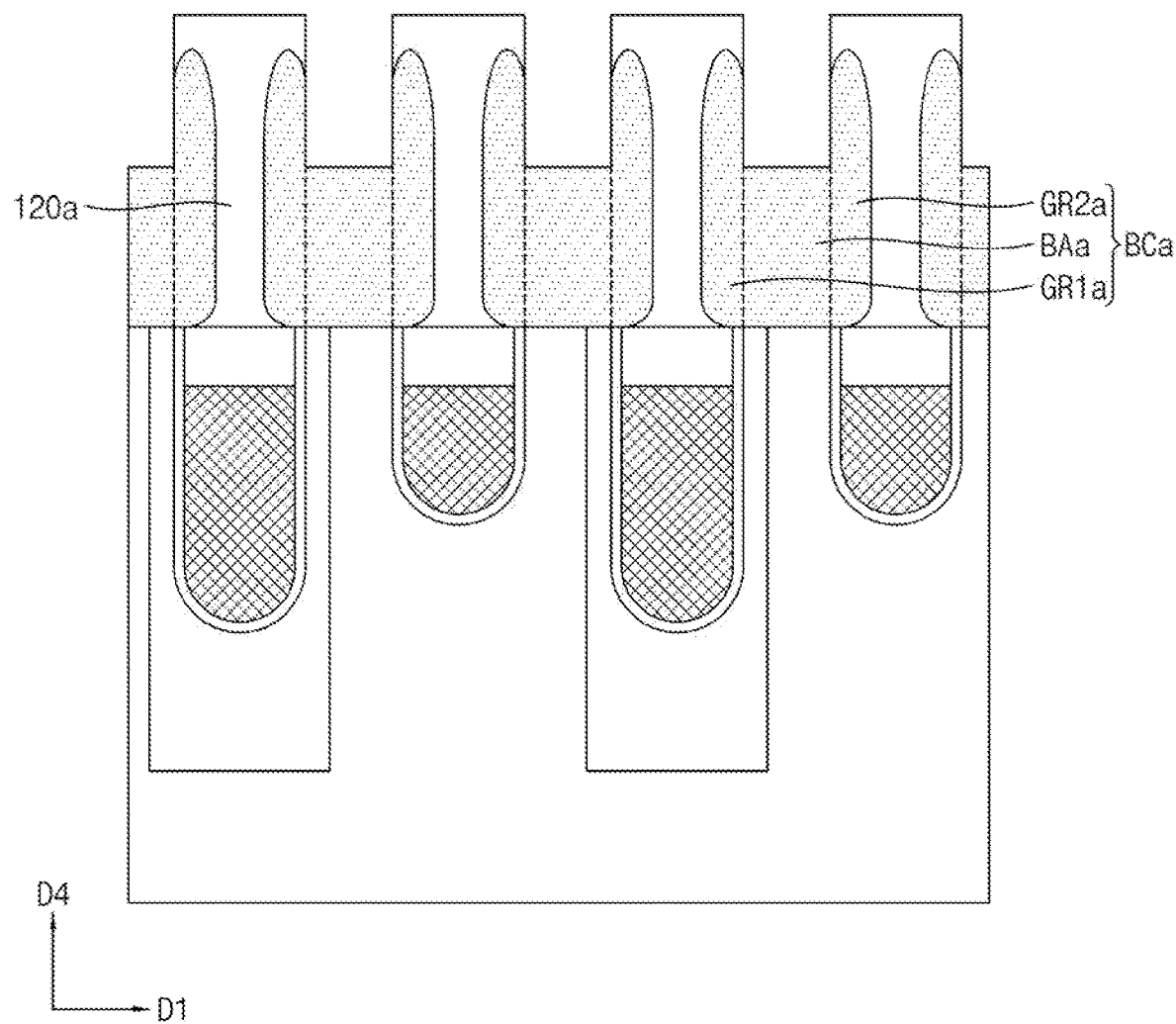
Figure 15:
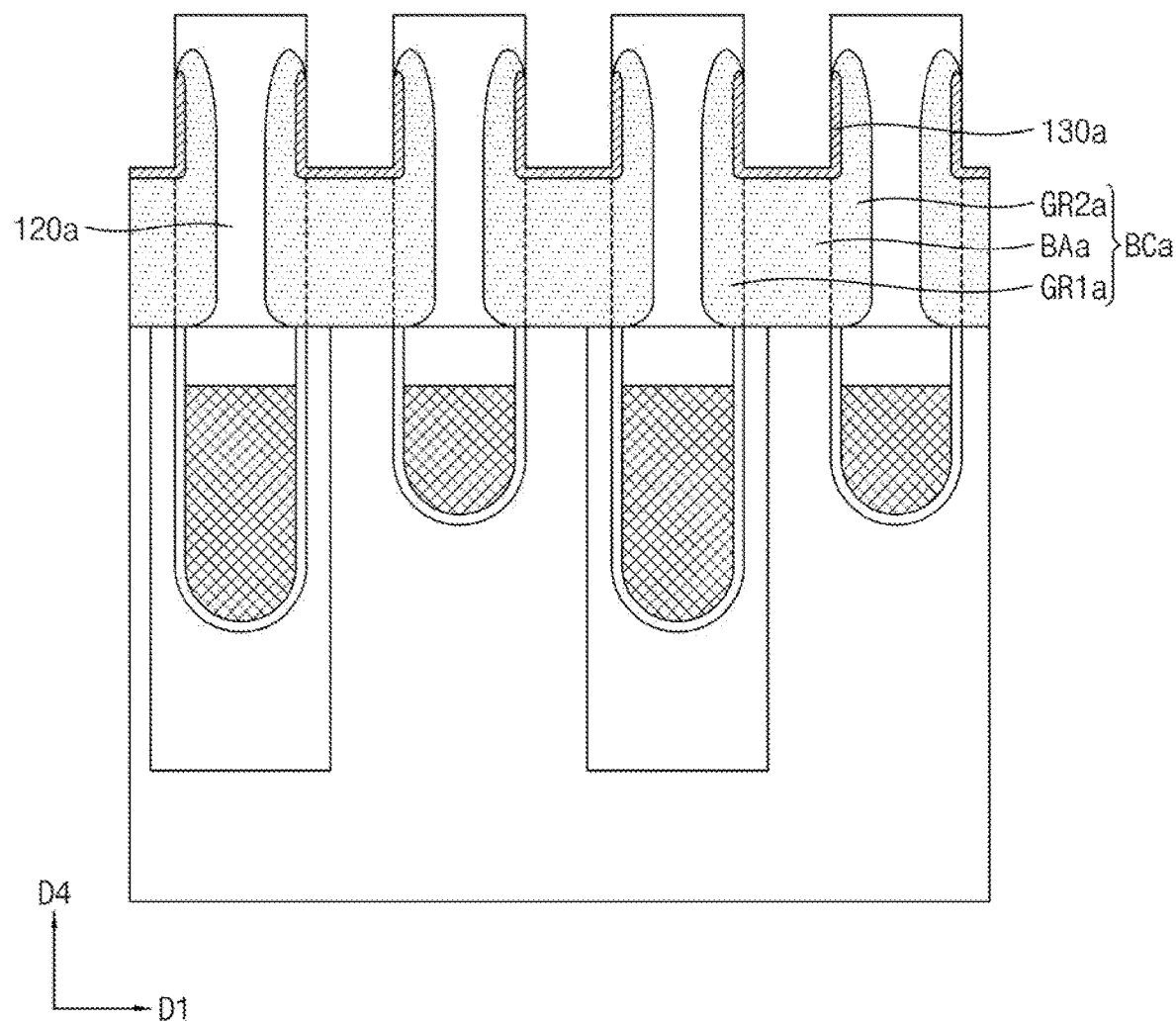

FIGS. 13, 14, and 15 are cross-sectional views of stages in a method for manufacturing a semiconductor device according to FIGS. 12A and 12B.

Referring to FIG. 13, insulating fences 120a may be formed after execution of processes similar to those of FIGS. 2A to 8B. The insulating fences 120a may be formed to completely cover buried contacts BCa. The insulating fences 120a may completely cover first and second growth portions GR1a and GR2a of the buried contacts BCa. The insulating fences 120a may be formed such that the level of top surfaces 120a_T of the insulating fences 120a is higher than the level of uppermost portions of the buried contacts BCa.

Referring to FIG. 14, mask patterns MPa may be removed. Thereafter, the buried contacts BCa may be etched. As the first and second growth portions GR1a and GR2a of the buried contacts BCa are covered by the insulating fences 120a, only base portions BAa of the buried contacts BCa (e.g., and inner side surfaces of the first and second growth portions GR1a and GR2a) may be etched in an etching process.

Referring to FIG. 15, contact patterns 130a may be formed. The contact pattern 130a may be formed on a top surface of the base portion BAa and inner side surfaces of the first and second growth portions GR1a and GR2a.

Referring to FIGS. 12A and 12B, landing pads LPa and an insulating structure Isa may be formed, and a capacitor structure CTa may be formed.

In the semiconductor device according to the exemplary embodiments, the buried contact thereof may include a growth portion and, as such, may have a sufficient surface area. Accordingly, resistance to current flowing through the buried contact may be reduced.

One or more embodiments may provide a semiconductor device having enhanced reliability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
an active pattern;
a gate structure connected to the active pattern;
a bit line structure connected to the active pattern;
a buried contact connected to the active pattern; and
a capacitor structure electrically connected to the buried contact, wherein:
the buried contact includes a base portion, and a first growth portion and a second growth portion at opposite sides of the base portion, and
a level of an uppermost portion of the first growth portion and a level of an uppermost portion of the second growth portion are higher than a level of a top surface of the base portion.

2. The semiconductor device as claimed in claim 1, further comprising a contact pattern between the buried contact and the capacitor structure,
wherein the contact pattern covers the uppermost portion of the first growth portion and the uppermost portion of the second growth portion.

3. The semiconductor device as claimed in claim 1, wherein:
the uppermost portion of the first growth portion is between an inner side surface and an outer side surface of the first growth portion; and
the uppermost portion of the second growth portion is between an inner side surface and an outer side surface of the second growth portion.

4. The semiconductor device as claimed in claim 3, wherein:
the first growth portion includes a first upper curved surface connected to the inner side surface of the first growth portion, and a second upper curved surface connected to the outer side surface of the first growth portion;
the second growth portion includes a third upper curved surface connected to the inner side surface of the second growth portion, and a fourth upper curved surface connected to the outer side surface of the second growth portion;
the uppermost portion of the first growth portion is between the first upper curved surface and the second upper curved surface; and
the uppermost portion of the second growth portion is between the third upper curved surface and the fourth upper curved surface.

5. The semiconductor device as claimed in claim 4, further comprising:
a first insulating fence covering the uppermost portion, the second upper curved surface, and the outer side surface of the first growth portion; and
a second insulating fence covering the uppermost portion, the fourth upper curved surface, and the outer side surface of the second growth portion.

6. The semiconductor device as claimed in claim 5, wherein:
the first insulating fence further covers the first upper curved surface, and the second insulating fence further covers the third upper curved surface.

7. A semiconductor device, comprising:
an active pattern;
a gate structure connected to the active pattern;
a bit line structure connected to the active pattern;
a buried contact connected to the active pattern; and
a capacitor structure electrically connected to the buried contact, wherein:
the buried contact includes a base portion, and a first growth portion and a second growth portion at opposite sides of the base portion,
the first growth portion includes a first upper curved surface and a second upper curved surface at opposite sides of an uppermost portion of the first growth portion, and
the second growth portion includes a third upper curved surface and a fourth upper curved surface at opposite sides of an uppermost portion of the second growth portion.

8. The semiconductor device as claimed in claim 7, wherein:
an inner side surface of the first growth portion is connected to the first upper curved surface and extends in a vertical direction, and
an inner side surface of the second growth portion is connected to the third upper curved surface and extends in the vertical direction.

9. The semiconductor device as claimed in claim 8, further comprising a landing pad between the buried contact and the capacitor structure,
wherein the landing pad includes an interposition portion between the inner side surface of the first growth portion and the inner side surface of the second growth portion.

10. The semiconductor device as claimed in claim 9, further comprising a contact pattern between the buried contact and the landing pad,
wherein the contact pattern includes:
a first portion between a bottom surface of the interposition portion and a top surface of the base portion,
a second portion between a first side surface of the interposition portion and the inner side surface of the first growth portion; and
a third portion between a second side surface of the interposition portion and the inner side surface of the second growth portion.

11. The semiconductor device as claimed in claim 10, wherein:
at least a part of the second portion extends in the vertical direction, and at least a part of the third portion extends in the vertical direction.

12. The semiconductor device as claimed in claim 7, wherein:
a distance between the first upper curved surface and the second upper curved surface gradually decreases toward the uppermost portion of the first growth portion; and
a distance between the third upper curved surface and the fourth upper curved surface gradually decreases toward the uppermost portion of the second growth portion.

13. The semiconductor device as claimed in claim 7, wherein:
a width of the first growth portion gradually decreases toward the uppermost portion of the first growth portion; and
a width of the second growth portion gradually decreases toward the uppermost portion of the second growth portion.

* * * * *